US009006049B2

(12) United States Patent
Assefa et al.

(10) Patent No.: US 9,006,049 B2
(45) Date of Patent: Apr. 14, 2015

(54) FABRICATING PHOTONICS DEVICES FULLY INTEGRATED INTO A CMOS MANUFACTURING PROCESS

(71) Applicant: International Business Machines Corporation, Armonk, NY (US)

(72) Inventors: Solomon Assefa, Ossining, NY (US); William M. J. Green, Astoria, NY (US); Yurii A. Vlasov, Katonah, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/085,752

(22) Filed: Nov. 20, 2013

(65) Prior Publication Data

US 2014/0080269 A1    Mar. 20, 2014

Related U.S. Application Data

(62) Division of application No. 12/951,597, filed on Nov. 22, 2010, now Pat. No. 8,633,067.

(51) Int. Cl.
*H01L 21/00* (2006.01)
*H01L 21/8238* (2006.01)
*H01L 21/762* (2006.01)
*G02B 6/136* (2006.01)
(Continued)

(52) U.S. Cl.
CPC ....... *H01L 21/8238* (2013.01); *H01L 21/26513* (2013.01); *H01L 21/76283* (2013.01); *G02B 6/136* (2013.01); *H01L 31/02327* (2013.01); *H01L 31/103* (2013.01); *H01L 31/105* (2013.01)

(58) Field of Classification Search
CPC ................. H01L 21/26513; H01L 21/76283; H01L 21/8238; H01L 31/02327; H01L 31/103; H01L 31/105; G02B 6/136
USPC ..................................................... 438/154
See application file for complete search history.

(56) References Cited

U.S. PATENT DOCUMENTS 5,908,305 A   6/1999  Crampton et al.
6,429,499 B1  8/2002  Heineke et al.
(Continued)

FOREIGN PATENT DOCUMENTS

JP      2003008054      1/2003

OTHER PUBLICATIONS

Kah-Wee Ang et al., "Low Thermal Budget Monolithic Integration of Evanescent-Coupled Ge-on-SOI Photodetector on Si CMOS Platform", IEEE Journal of Selected Topicds in Quantum Electronics, vol. 16, No. 1, Jan./Feb. 2010, pp. 106-112.

(Continued)

*Primary Examiner* — Shaun Campbell
(74) *Attorney, Agent, or Firm* — Law Offices of Ira D. Blecker, P.C.

(57) ABSTRACT

Disclosed are process enhancements to fully integrate the processing of a photonics device into a CMOS manufacturing process flow. A CMOS wafer may be divided into different portions. One of the portions is for the CMOS devices and one or more other portions are for the photonics devices. The photonics devices include a ridged waveguide and a germanium photodetector. The germanium photodetector may utilize a seeded crystallization from melt process so there is more flexibility in the processing of the germanium photodetector.

17 Claims, 25 Drawing Sheets

(51) Int. Cl.
  *H01L 31/0232* (2014.01)
  *H01L 31/103* (2006.01)
  *H01L 31/105* (2006.01)
  *H01L 21/265* (2006.01)

(56) References Cited

U.S. PATENT DOCUMENTS

| | | |
|---|---|---|
| 6,897,498 B2 | 5/2005 | Gothoskar et al. |
| 6,991,892 B2 | 1/2006 | Block |
| 7,008,813 B1 | 3/2006 | Lee et al. |
| 7,262,117 B1 | 8/2007 | Gunn, III et al. |
| 7,453,132 B1 | 11/2008 | Gunn, III et al. |
| 7,498,243 B2 | 3/2009 | Liu et al. |
| 7,613,369 B2 | 11/2009 | Witzens et al. |
| 7,616,904 B1 | 11/2009 | Gunn, III et al. |
| 7,732,886 B2 | 6/2010 | Shih et al. |
| 7,875,522 B2 | 1/2011 | Kapur et al. |
| 2004/0092104 A1 | 5/2004 | Gunn, III et al. |
| 2009/0022500 A1 | 1/2009 | Pinguet et al. |
| 2009/0108384 A1 | 4/2009 | Assefa et al. |
| 2009/0184372 A1 | 7/2009 | Icel et al. |
| 2010/0059822 A1 | 3/2010 | Pinguet et al. |

OTHER PUBLICATIONS

M. Oehme et al., "Group-IV Heteroepitaxial Films for Optoelectronic Applications", ISDRS 2009, Dec. 9-11, 2009, College Park, MD, USA.

C.L.Schow et al., "Optical Receivers in CMOS using Ge-on-SOI Photodiodes", Lasers and Electrooptics Society, 2006, LEOS 2006, 19th Annual Meeting of the IEEE, Oct. 2006, Montreal, Quebec.

Ian A. Young, "Optical I/O Technology for Tera-Scale Computing", IEEE Journal of Solid-State Circuits, vol. 45, No. 1, Jan. 2010, pp. 235-248.

Prosecution History of related U.S. Appl. No. 14/085,748, Notice of Allowance mailed Dec. 11, 2014, all pages.

A

B

C

Ge DETECTOR

A

WAVEGUIDE

B

CMOS

C

A

B

C

FABRICATING PHOTONICS DEVICES FULLY INTEGRATED INTO A CMOS MANUFACTURING PROCESS

RELATED APPLICATIONS

This application is a divisional patent application of U.S. patent application Ser. No. 12/951,597, filed Nov. 22, 2010, entitled "FABRICATING PHOTONICS DEVICES FULLY INTEGRATED INTO A CMOS MANUFACTURING PROCESS", now U.S. Pat. No. 8,633,067, and is related to U.S. patent application Ser. No. 14/085,748, filed even date herewith, entitled "FABRICATING PHOTONICS DEVICES FULLY INTEGRATED INTO A CMOS MANUFACTURING PROCESS", the disclosures of which are incorporated by reference herein.

BACKGROUND

The exemplary embodiments relate generally to the processing of integrated circuits and, more particularly, relate to the processing of photonics devices integrated into the processing of integrated circuits.

Optical interconnects can offer significant advantages over electrical circuitry in the field of advanced microelectronics. One possible implementation of an optical interconnect system is based on silicon-on-insulator (SOI) technology, in which optical waveguides are formed on the same thin silicon layer as other complimentary-metal-oxide-semiconductor (CMOS) circuit elements (e.g., field effect transistors (FETs), capacitors, resistors, etc.). Light sources produce optical signals (e.g., light pulses) that propagate in these optical waveguides. Photodetectors convert the optical signals into electrical signals.

The integration of germanium into a conventional CMOS process is complicated by the additional thermal budget required by germanium growth, the maximum temperature germanium can withstand, cross-contamination issues, germanium doping issues, germanium passivation issues, and the tendency of germanium to form non-ohmic contacts when mated with those metallic materials conventionally used for vertical contacts. There is a need, as a result, for structures and process integration schemes that overcome some or all of these issues and allow waveguides and germanium photodetectors to be effectively fabricated in a manner that is compatible with conventional CMOS processing.

BRIEF SUMMARY

The various advantages and purposes of the exemplary embodiments as described above and hereafter are achieved by providing, according to a first aspect of the exemplary embodiments, a method of incorporating a photonics device into a CMOS manufacturing process flow which includes: providing a semiconductor substrate wherein the semiconductor substrate is a semiconductor on insulator substrate comprising a semiconductor material layer on a buried oxide layer; processing a first portion of the semiconductor substrate to form a CMOS device according to a CMOS manufacturing process flow. Processing the first portion includes: patterning the semiconductor material layer in the semiconductor substrate to form first trenches between first pillars of semiconductor material; filling the first trenches with an insulator material; well and Vt implanting; forming a gate structure; forming source and drain implants; and forming contacts. The method further includes processing a second portion of the semiconductor substrate according to a process flow for a photonics device. Processing the second portion includes: patterning a semiconductor material layer in the semiconductor substrate to form second trenches between second pillars of semiconductor material; filling the second trenches with an insulator material; depositing a dielectric material over the second portion; opening a window in the dielectric material to expose an underlying second pillar of semiconductor material; depositing a layer of germanium over the first and second portions including over the dielectric material; depositing a first insulating layer over the germanium layer; patterning the germanium layer and first insulating layer over the second portion and removing the germanium layer and first insulating layer from the first portion; and depositing a nitride layer over the germanium layer and first insulating layer so as to encapsulate the germanium layer and first insulating layer. The process steps of patterning a semiconductor material layer through depositing a nitride layer over the germanium layer in the processing the second portion of the semiconductor substrate occur after filling the first trenches with an insulator material in the processing the first portion of the semiconductor substrate. The method further includes processing the second portion of the semiconductor substrate further comprising: opening the first insulating layer and the nitride layer to form an opening; depositing an oxide material over the first and second portions and in the opening; and depositing a metallic material to make contact with the germanium layer.

According to a second aspect of the exemplary embodiments, there is provided a method of incorporating a photonics device into a CMOS manufacturing process flow which includes: providing a semiconductor substrate wherein the semiconductor substrate is a semiconductor on insulator substrate comprising a semiconductor material layer on a buried oxide layer; processing a first portion of the semiconductor substrate to form a CMOS device according to a CMOS manufacturing process flow and processing a second portion of the semiconductor substrate according to a process flow for a photonics device. Processing a first portion of the semiconductor substrate includes: patterning the semiconductor material layer in the semiconductor substrate to form first trenches between first pillars of semiconductor material; filling the first trenches with an insulator material; well and Vt implanting; forming a gate structure; forming source and drain implants; and forming contacts. Processing the second portion includes: patterning a semiconductor material layer in the semiconductor substrate to form second trenches between second pillars of semiconductor material; filling the second trenches with an insulator material; depositing a dielectric material over the second portion; opening a window in the dielectric material to expose an underlying second pillar of semiconductor material; depositing a layer of germanium over the first and second portions including over the dielectric material; depositing a first insulating layer over the germanium layer; patterning the germanium layer and first insulating layer over the second portion and removing the germanium layer and first insulating layer from the first portion; and depositing a nitride layer over the germanium layer and first insulating layer so as to encapsulate the germanium layer and first insulating layer. Processing the second portion of the semiconductor substrate during the forming contacts step in the processing the first portion, further including: opening the first insulating layer and the nitride layer in a first area to expose a first area of the germanium layer; implanting a dopant in the first area of the germanium layer; opening the first insulating layer and the nitride layer in a second area to expose a second area of the germanium layer; and implanting a second dopant in the second area of the germanium layer.

According to a third aspect of the exemplary embodiments, there is provided a method of incorporating a photonics device into a CMOS manufacturing process flow including: providing a semiconductor substrate; processing a first portion of the semiconductor substrate to form a CMOS device according to a CMOS manufacturing process flow, processing a second portion of the semiconductor substrate according to a process flow for a first photonics device and processing a third portion of the semiconductor substrate according to a process flow for a second photonics device. Processing the first portion of the semiconductor substrate includes; patterning the semiconductor material layer in the semiconductor substrate to form first trenches between first pillars of semiconductor material; filling the first trenches with an insulator material; well and Vt implanting; forming a gate structure; forming source and drain implants; and forming contacts. Processing the second portion of the semiconductor substrate includes: patterning a semiconductor material layer in the semiconductor substrate to form second trenches between second pillars of semiconductor material; filling the second trenches with an insulator material; low dose implanting at least one of the second pillars to form a pn or p-i-n junction; and high dose implanting at least another one of the second pillars to form a low resistance contact. Processing the third portion of the semiconductor substrate includes: patterning a semiconductor material layer in the semiconductor substrate to form third trenches between third pillars of semiconductor material; filling the third trenches with an insulator material; depositing a dielectric material over the third portion; opening a window in the dielectric material to expose an underlying third pillar of semiconductor material; depositing a layer of germanium over the first and third portions including over the dielectric material; depositing a first insulating layer over the germanium layer; patterning the germanium layer and first insulating layer over the third portion and removing the germanium layer and first insulating layer from the first portion; and depositing a nitride layer over the germanium layer and first insulating layer so as to encapsulate the germanium layer and first insulating layer. The process steps of patterning a semiconductor material layer through depositing a nitride layer over the germanium layer in the processing the third portion of the semiconductor substrate occur after filling the first trenches with an insulator material in the processing of the first portion of the semiconductor substrate. Processing the third portion of the semiconductor substrate further includes: opening the first insulating layer and the nitride layer to form an opening; depositing an oxide material over the first and third portions and in the opening; and depositing a metallic material to make contact with the germanium layer in the third portion.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1 to 15 are cross-sectional views of an exemplary embodiment of integrating the processing of photonics devices into a CMOS manufacturing line wherein FIGS. 1 and 2 illustrate the patterning of a semiconductor substrate for the formation of a germanium photodetector, waveguide and CMOS device;

FIG. 3 illustrates the deposition of oxide to fill the trenches formed in FIGS. 1 and 2;

FIG. 4 illustrates the removal of a silicon nitride layer;

FIG. 5 illustrates the formation of the gate structure for the CMOS device;

FIG. 6 illustrates the formation of a silicide blocking layer;

FIG. 7 illustrates the formation of a germanium layer and capping layer;

FIG. 8 illustrates the formation of a germanium stack on the germanium photodetector and the removal of the germanium layer and capping layer from the waveguide and CMOS device;

FIG. 9 illustrates the encapsulation of the germanium stack;

FIGS. 10 and 11 illustrate the preparation of the waveguide and CMOS device for forming a silicide (not shown);

FIGS. 12 to 14 illustrate the formation of contacts; and

FIG. 15 illustrates the formation of the first level of metal wiring.

FIGS. 17 to 25 are process flow charts for alternative exemplary embodiments wherein FIG. 17 illustrates the patterning of the waveguide later in the CMOS process flow;

FIG. 18 illustrates the low dose implants being done later in the CMOS process flow;

FIG. 19 illustrates the high dose implants being done earlier in the CMOS process flow;

FIG. 20 illustrates a modified process flow for forming the germanium photodetector;

FIG. 21 illustrates a process step for removing silicon nitride and germanium stringers incorporated into the process flow for forming the germanium photodetector;

FIG. 22 illustrates forming the germanium photodetector earlier in the CMOS process flow;

FIG. 23 illustrates an alternative embodiment for forming the germanium photodetector earlier in the CMOS process flow;

FIG. 24 illustrates a further alternative embodiment for forming the germanium photodetector earlier in the CMOS process flow; and FIG. 25 illustrates a process flow for formation of dopant implants in germanium photodetectors.

DETAILED DESCRIPTION

Figure 1:
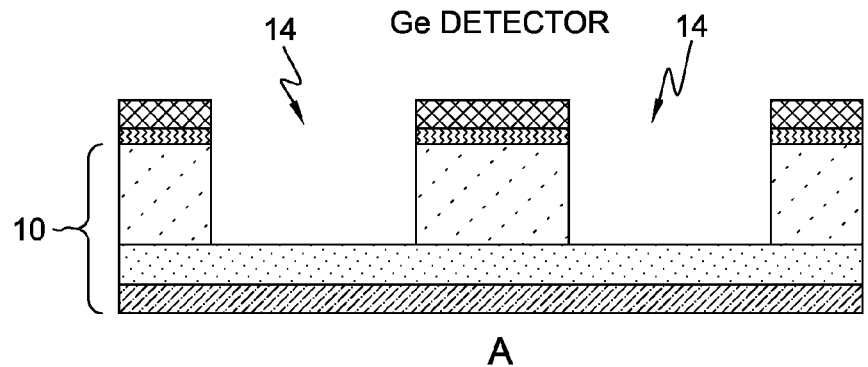
Figure 1:
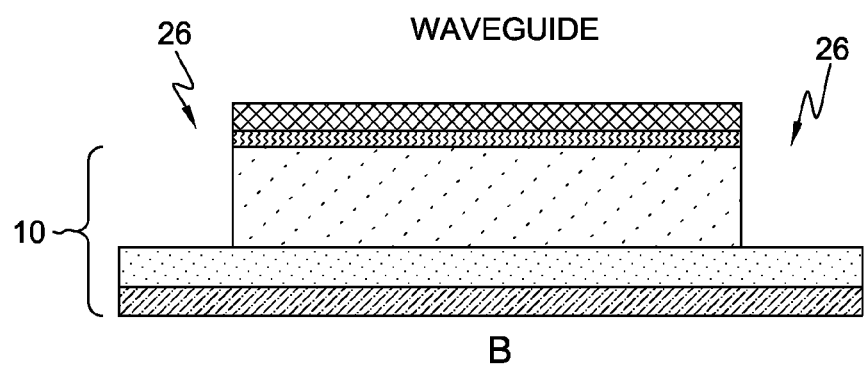
Figure 1:
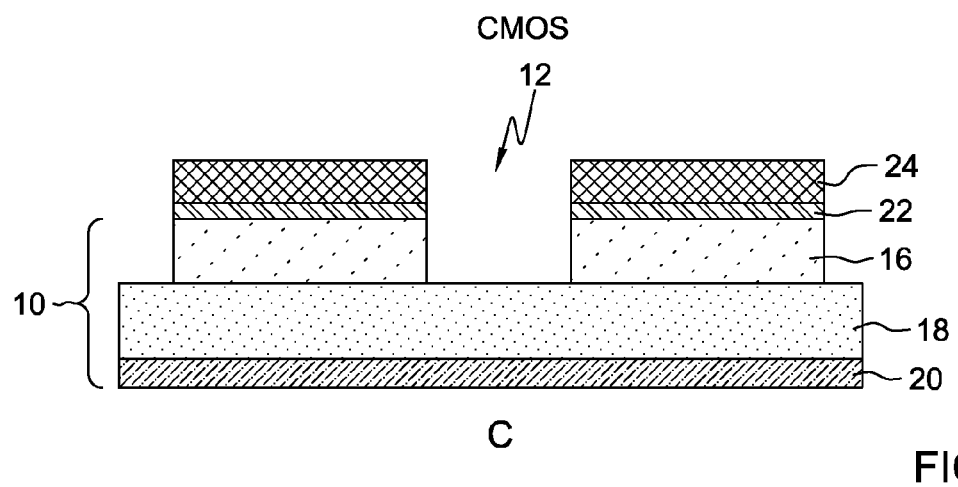

The present invention will be described with reference to exemplary embodiments. For this reason, numerous modifications can be made to these embodiments and the results will still come within the scope of the invention. No limitations with respect to the specific embodiments described herein are intended or should be inferred.

Particularly with respect to processing steps, it is emphasized that the descriptions provided herein are not intended to encompass all of the processing steps which may be required to successfully form a functional device in an integrated circuit. Rather, certain processing steps which are conventionally used in forming integrated circuit devices, such as, for example, wet cleaning and annealing steps which are not germane to the exemplary embodiments, are purposefully not described herein for economy of description. However one skilled in the art will readily recognize those processing steps omitted from this generalized description. Moreover, details of conventional semiconductor processing steps described herein will only be described generally since the details of these conventional processes will be known to one skilled in the art and since there are commercially available semiconductor processing tools for implementing these processing steps.

It should also be understood that the various layers and/or regions shown in the accompanying Figures are not drawn to scale, and that one or more semiconductor layers and/or regions of a type commonly used in such integrated circuits may not be explicitly shown in a given Figure for ease of explanation. This does not imply that the semiconductor layers and/or regions not explicitly shown are omitted from the actual integrated circuit. Also, where identical features are found in the different illustrative embodiments, identical reference numerals will be utilized.

Referring now to FIGS. 1 to 15, there are shown cross sectional views of an exemplary embodiment of integrating the processing of a germanium photodetector and ridged waveguide into a CMOS manufacturing process. In the FIGS. 1 to 15, the "A" view is for the processing of the germanium photodetector, the "B" view is for the processing of the ridged waveguide and the "C" view is for the processing of a CMOS device or, in some views, CMOS devices. It should be understood that while these views are shown separately, each of the germanium photodectector, ridged waveguide and CMOS device may be on the same substrate.

Figure 15:
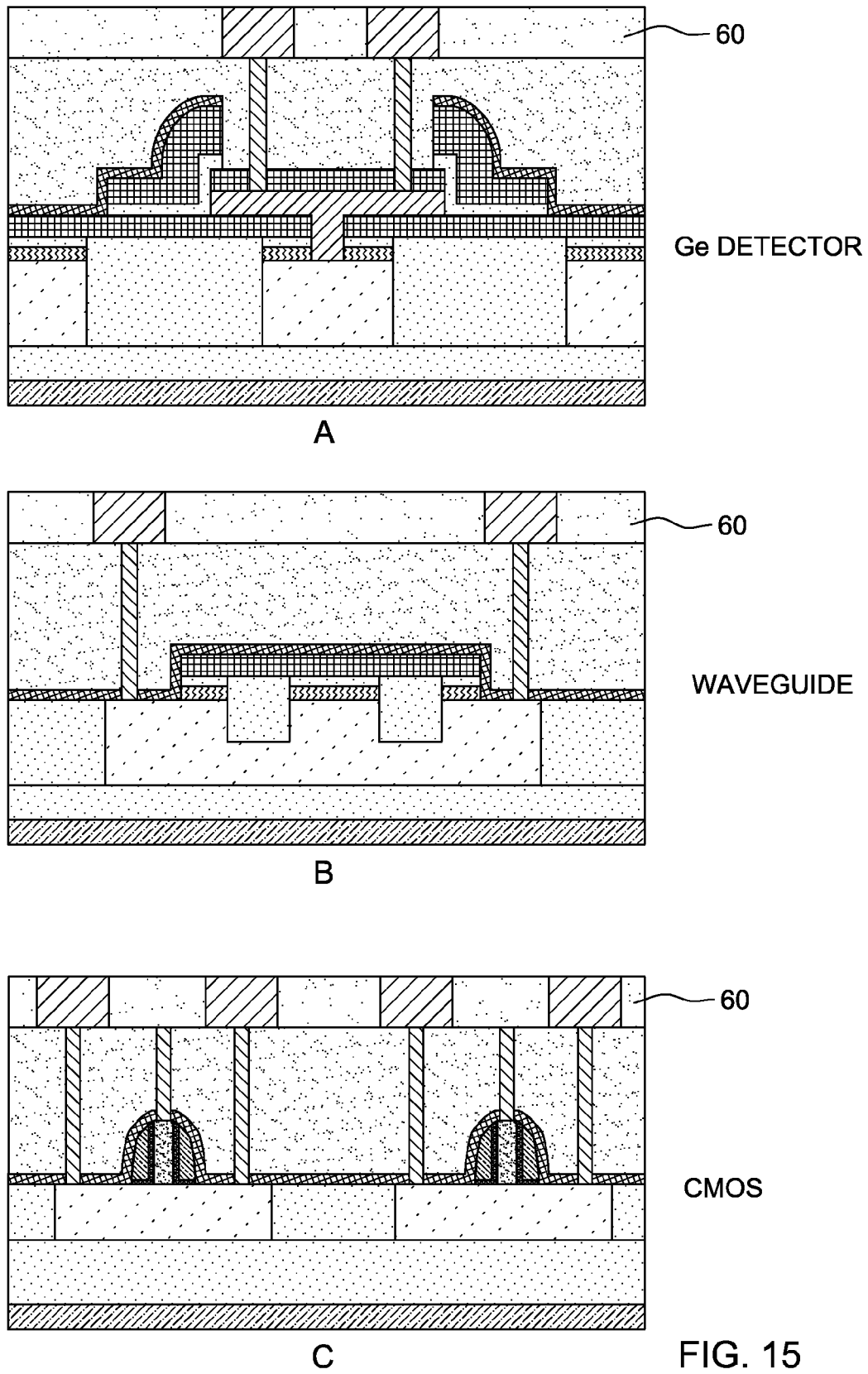
Figure 16:
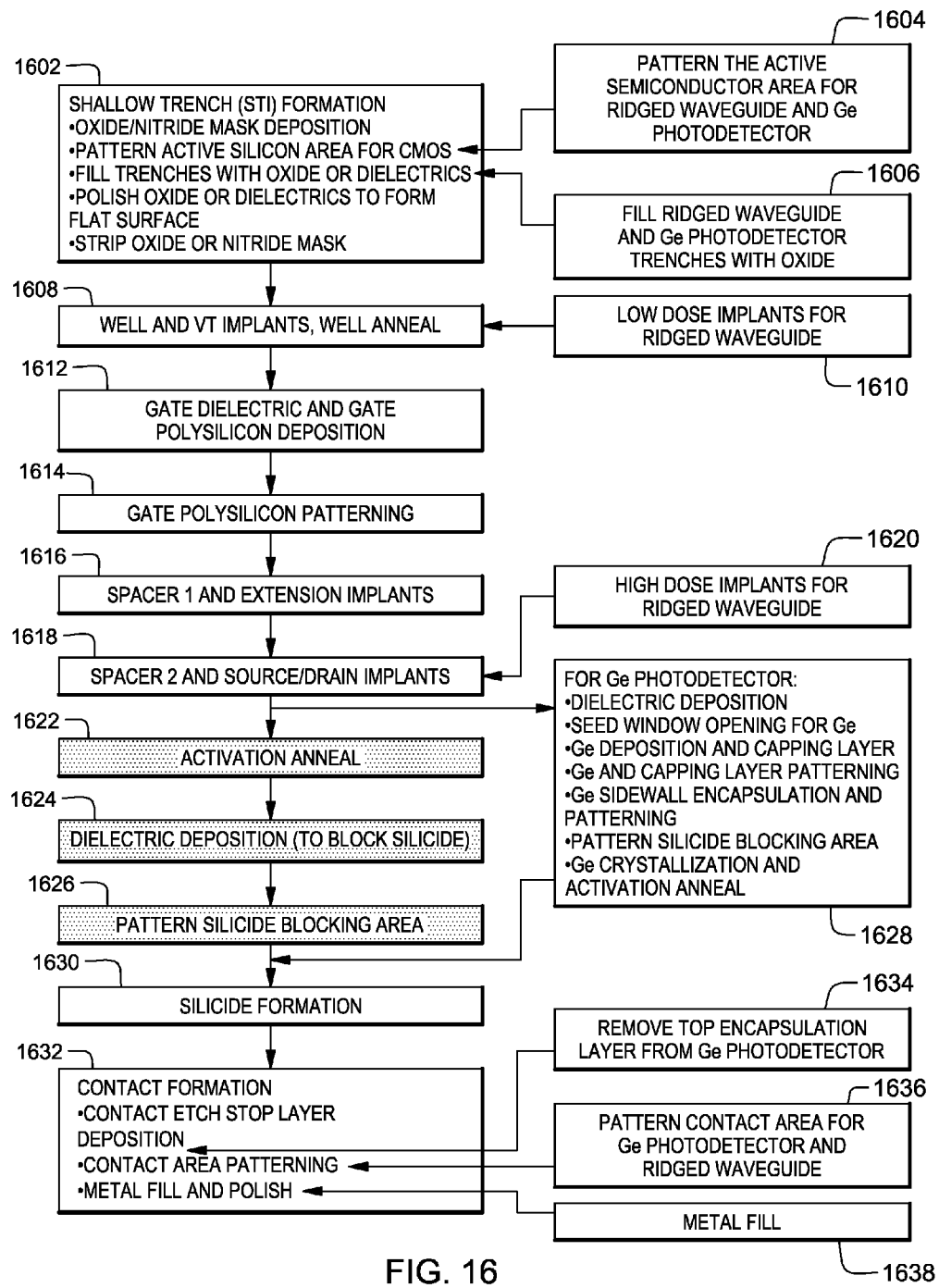
FIG. 16 is a process flow chart illustrating the process flow of the exemplary embodiment of FIGS. 1 to 15.

FIG. 16 is a flow chart for the exemplary embodiment in FIGS. 1 to 16 illustrating a CMOS process flow on the left and a process flow on the right illustrating the integration of the processing of a germanium photodetector and ridged waveguide into the CMOS process flow.

It should be understood that while the description refers to both a germanium photodetector and ridged waveguide integrated into a CMOS manufacturing process, it is within the scope of the present invention to integrate only one of the germanium photodetector and ridged waveguide into the CMOS manufacturing process.

Referring first to FIG. 16, the CMOS process flow in box 1602 calls for shallow trench isolation (STI) formation by patterning a semiconductor substrate to form trenches and then filling the trenches with an oxide. During the patterning of the trenches for the CMOS device in box 1602, the active semiconductor area for the ridged waveguide and germanium photodetector may also be patterned as indicated in box 1604. During the filling of the trenches for the CMOS device in box 1602, the trenches for the ridged waveguide and germanium photodetector may also be filled as indicated in box 1606.

Referring now to FIG. 1, there is shown a first step for patterning the active semiconductor areas for a germanium photodetector, ridged waveguide (hereafter just waveguide) and CMOS device on a semiconductor substrate 10. In an exemplary embodiment, semiconductor substrate 10 is a semiconductor on insulator (SOI) substrate which includes a semiconductor layer 16 on a buried oxide (BOX) layer 18. The semiconductor layer 16 may have a thickness of about 50 to 500 nm (nanometers) while the BOX layer 18 may have a thickness of at least 100 nm. The SOI structure is typically built on a semiconductor wafer 20.

Semiconductor substrate 10 may also be a semiconductor on insulator formed locally on a bulk substrate using any local oxidation process such as SIMOX technology. In this case, there is a local area in the semiconductor substrate containing a silicon layer on a BOX layer and the remainder of the semiconductor substrate is a bulk semiconductor wafer.

The semiconductor layer and semiconductor wafer may include but not be limited to group IV semiconductors such as silicon, silicon germanium or germanium, a III-V compound semiconductor, or a II-VI compound semiconductor. Buried oxide layer may be silicon oxide or other dielectric materials.

The remainder of the discussion will focus on the SOI structure shown in FIG. 1.

Also shown in FIG. 1 are pad oxide 22 and silicon nitride 24, the latter which has been deposited to form a hard mask for forming trenches 12 in the CMOS device, trenches 14 in the germanium photodetector and first trenches 26 for the waveguide. The trenches 12, 14 and 26 may be formed by a process such as reactive ion etching (RIE).

Figure 2:
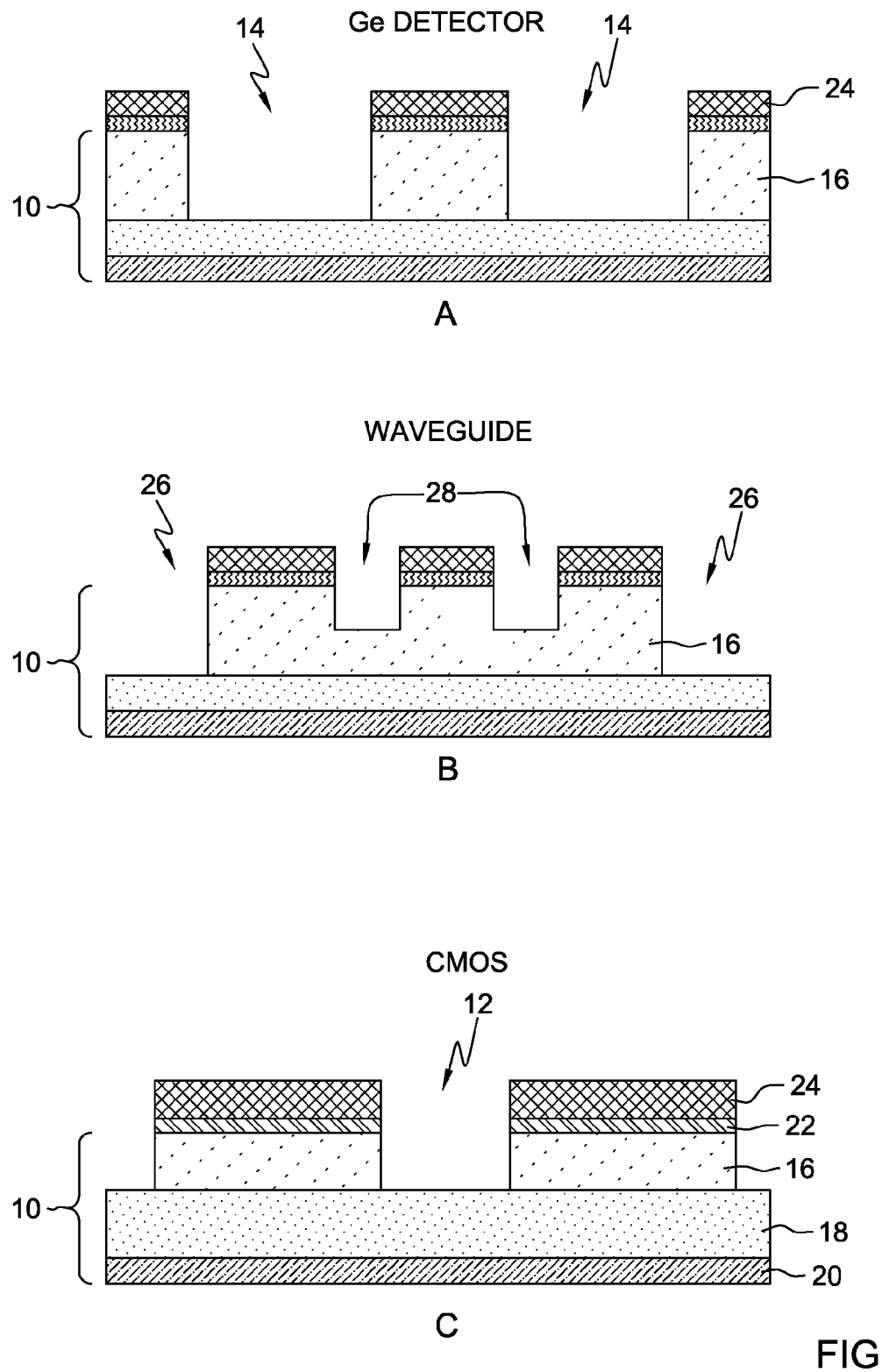

Illustrated in FIG. 2 are the second trenches 28 formed for the waveguide. Second trenches should not extend all the way through the semiconductor layer 16. In one exemplary embodiment, there should be about 10 to 150 nm of semiconductor layer 16 left at the bottom of trenches 28. In this process, the CMOS device and germanium photodetector may need to be masked to prevent further etching of the CMOS device and germanium photodetector. Pillars of semiconductor layer 16 result in the germanium photodetector, waveguide and CMOS device after the etching steps.

Figure 3:
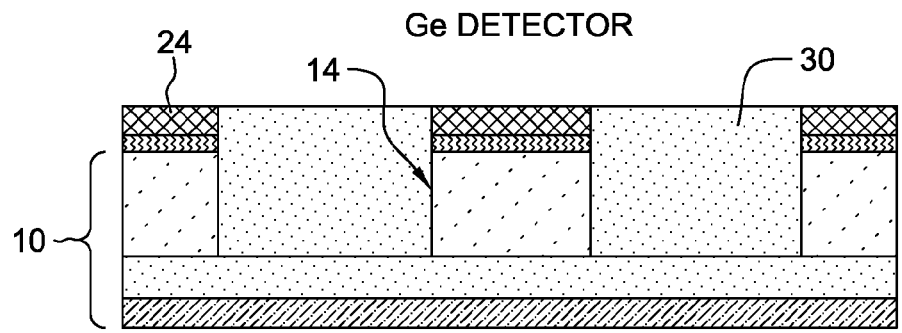
Figure 3:
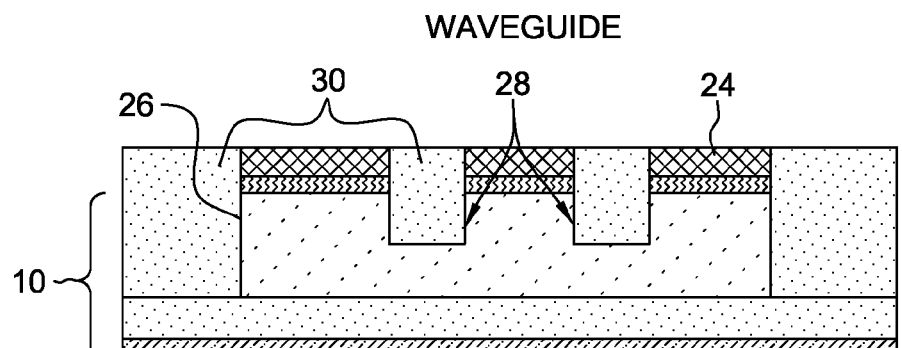
Figure 3:
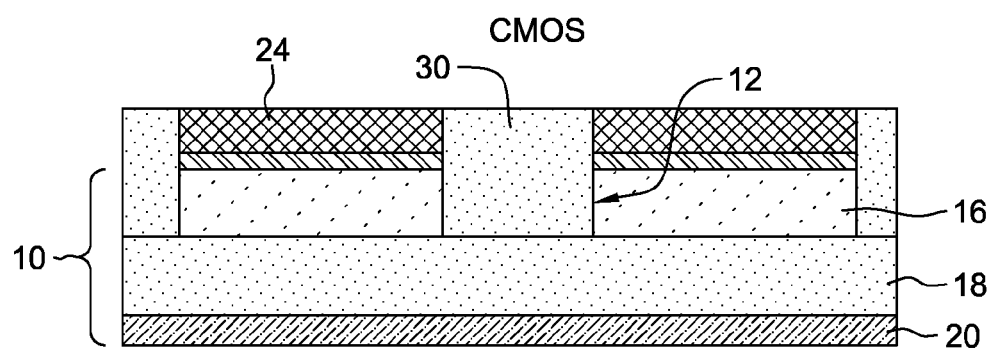

Oxide 30 is then conventionally deposited to fill the trenches 12 for the CMOS device, trenches 14 for the germanium photodetector and trenches 26, 28 for the waveguide as shown in FIG. 3.

Figure 4:
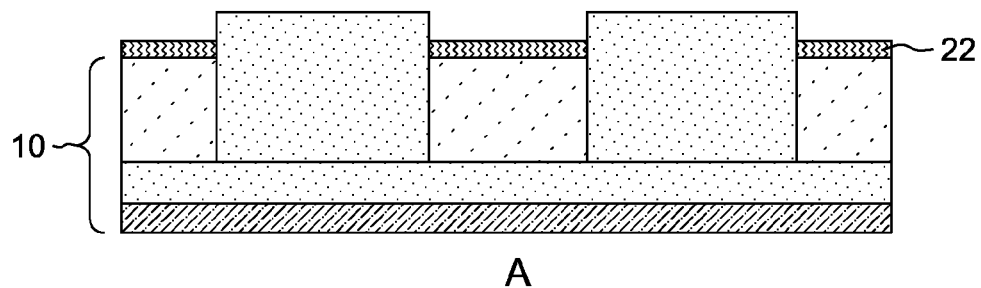
Figure 4:
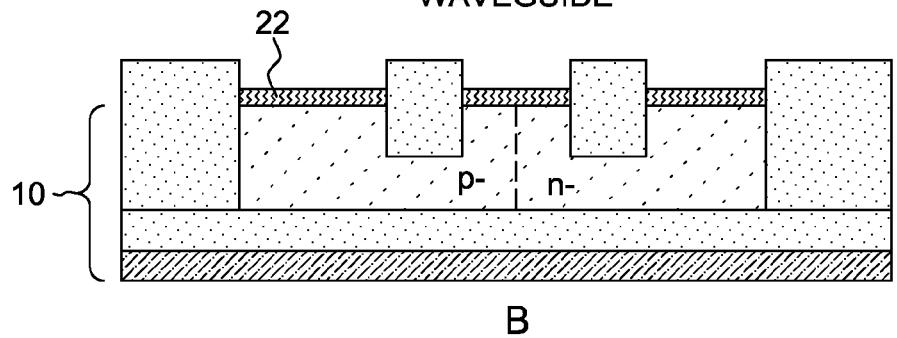
Figure 4:
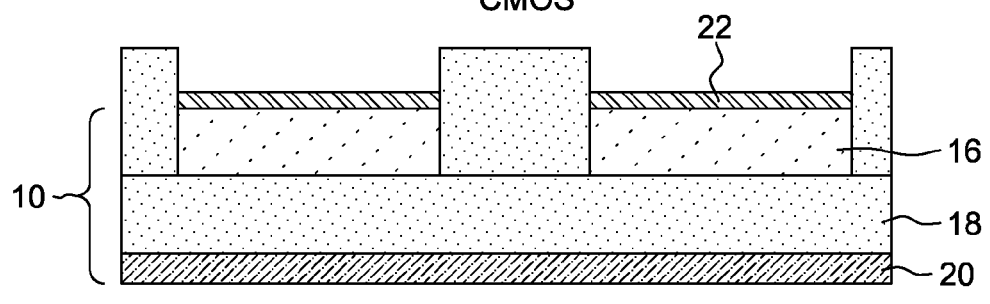

Referring now to FIGS. 4 and 16, the silicon nitride layer 24 has been stripped leaving the pad oxide layer 22. Well and $V_t$ implants are then conventionally done for the CMOS device as indicated in box 1608 in FIG. 16. The implant energy for photonic devices depends on the thickness of the SOI layer 16 and height of the ridge for the ridged waveguide. Low dose implants (at a concentration of about $1 \times 10^{16}$ to $3 \times 10^{18}/cm^3$) box 1610 may be done for the waveguide just after the well implants and just before the $V_t$ implants are done for the CMOS device. For n-type implants, the implant specie may be phosphorus, arsenic or antimony while for p-type implants, the implant specie may be boron or boron fluoride. As a result of the low dose implants, a PN or P-I-N junction is formed as shown in FIG. 4. In an alternative exemplary embodiment, the low dose implants may be done just before the well implants and $V_T$ implants.

Figure 5:
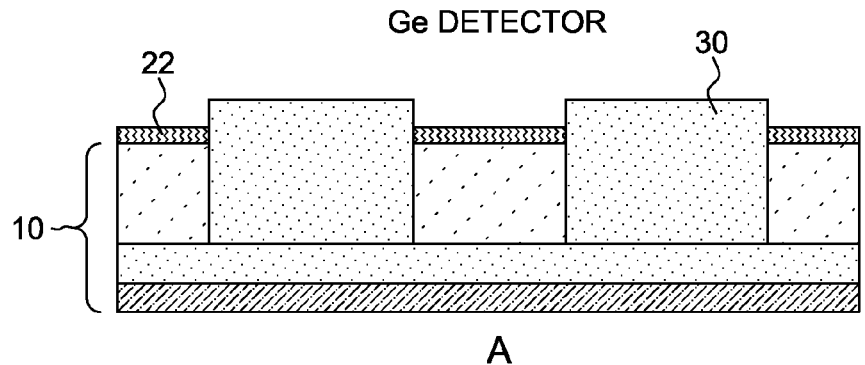
Figure 5:
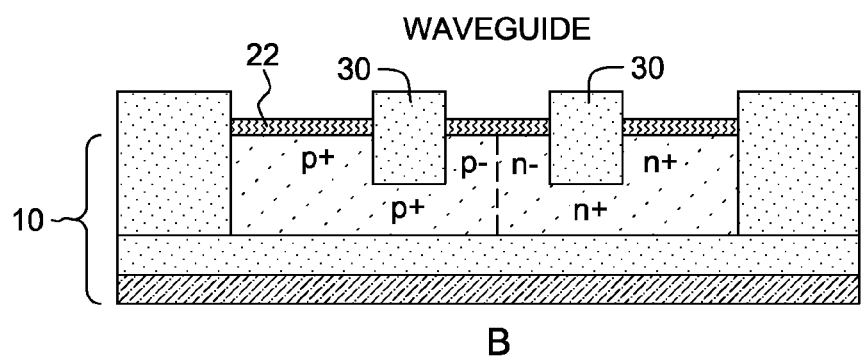
Figure 5:
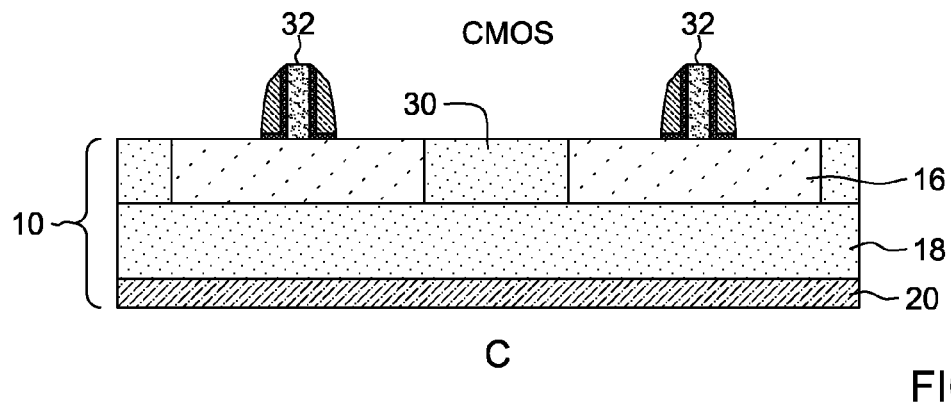

As further illustrated in FIG. 16, the gate structure for the CMOS device is formed by depositing the gate dielectric and gate polysilicon, box 1612, patterning the gate polysilicon, box 1614, and forming spacer 1 and extension implants, box 1616. Box 1618 requires the forming of spacer 2 and source and drain implants. However, before the source and drain implants, high dose implants (at a concentration above $5 \times 10^{18}/cm^3$) for the waveguide may be done, box 1620. The high dose implants may be, for example, phosphorus, arsenic or antimony for an n-type device implanted at about 80-200 KeV and boron or boron fluoride for a p-type device implanted at about 20-80 KeV. As shown in FIG. 5, the gate structure 32 has been formed for the CMOS device and the waveguide has low dose and high dose implants. In an alternative exemplary embodiment, the high dose implants may be done just after the source and drain implants.

Referring back to FIG. 16, the manufacturing process may deviate from the CMOS process flow. CMOS process steps for activation anneal, box 1622, dielectric deposition, box 1624, and pattern silicide blocking area, box 1626, may be replaced by and supplemented by the process flow shown in box 1628. The processing described in box 1628 is further described with reference to FIGS. 6 to 10.

Figure 6:
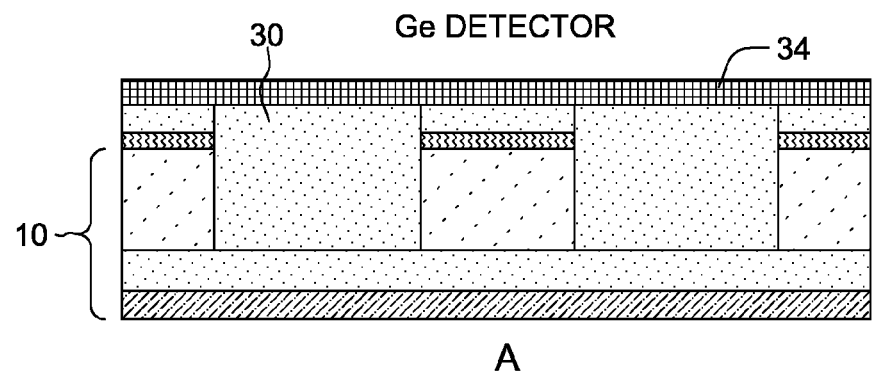
Figure 6:
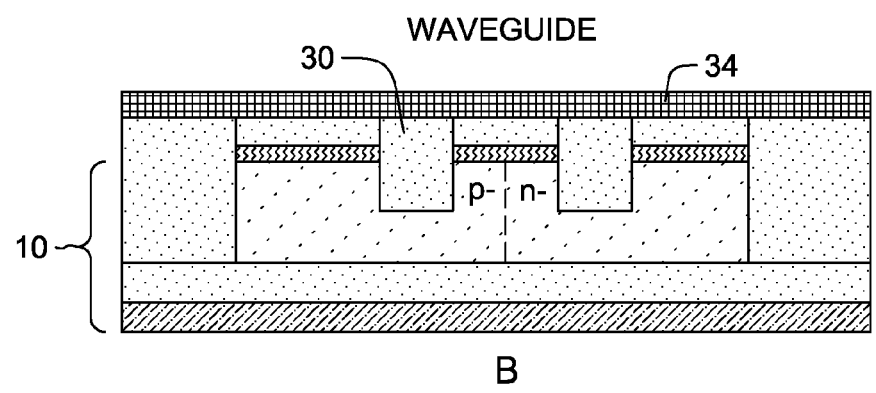
Figure 6:
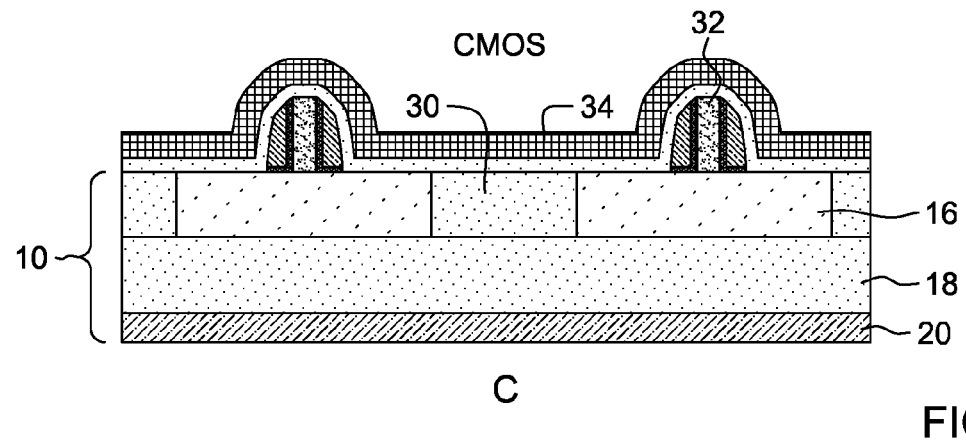

In FIG. 6, silicon nitride dielectric layer 34 is deposited everywhere including covering the CMOS devices and gate structures 32. Instead of silicon nitride, silicon oxynitride or any other layer that is useful for blocking the formation of silicide may be used. The silicon nitride dielectric layer 34, or the alternative layers just mentioned, may be deposited by a process such as plasma enhanced chemical vapor deposition (PECVD), low pressure chemical vapor deposition (LPCVD) or rapid thermal chemical vapor deposition (RTCVD).

Figure 7:
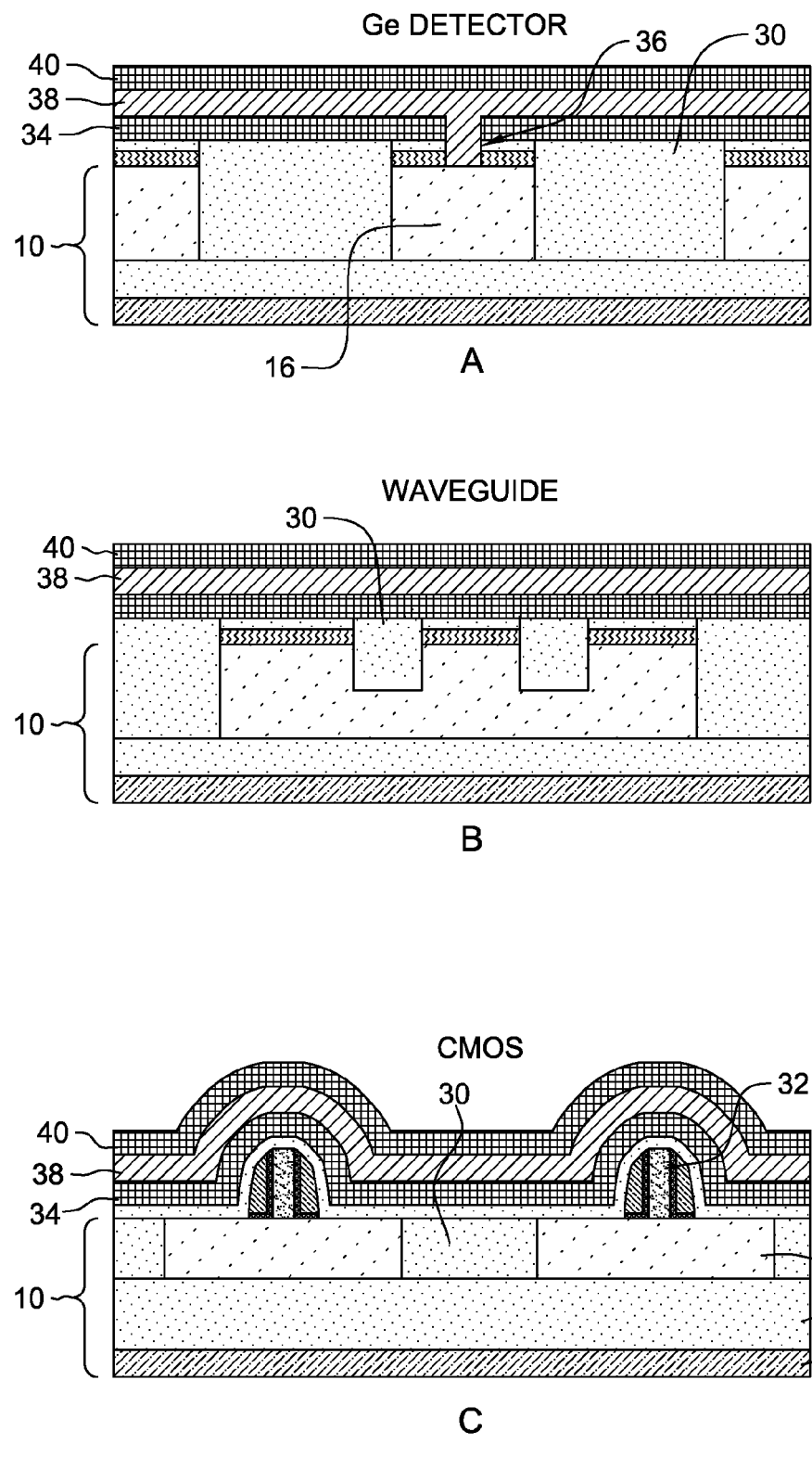

Referring now to FIG. 7, the silicon nitride dielectric layer 34 is opened at 36 to expose semiconductor layer 16. Thereafter, germanium layer 38 is deposited everywhere including covering the waveguide and CMOS devices. The germanium layer 38 may be deposited by, for example, chemical vapor deposition or physical vapor deposition. It is not necessary to deposit epitaxial germanium for the present exemplary embodiments since the germanium will be heated to melting in another step which would destroy any initial epitaxy. The present invention uses a seeded crystallization from melt process for forming epitaxial germanium. According to this process, the semiconductor layer 16 acts as a seed for the germanium layer 38. During later processing, a crystallization anneal is performed where the germanium layer 38 melts and upon cooling, epitaxial growth occurs first from the opening to the semiconductor layer 16 and then all along the silicon nitride dielectric layer 34.

The germanium layer 38 may be followed by deposition everywhere of a silicon nitride dielectric capping layer 40 including over the waveguide and CMOS devices. Silicon nitride dielectric capping layer 40 may be deposited, for example, by plasma enhanced chemical vapor deposition.

Figure 8:
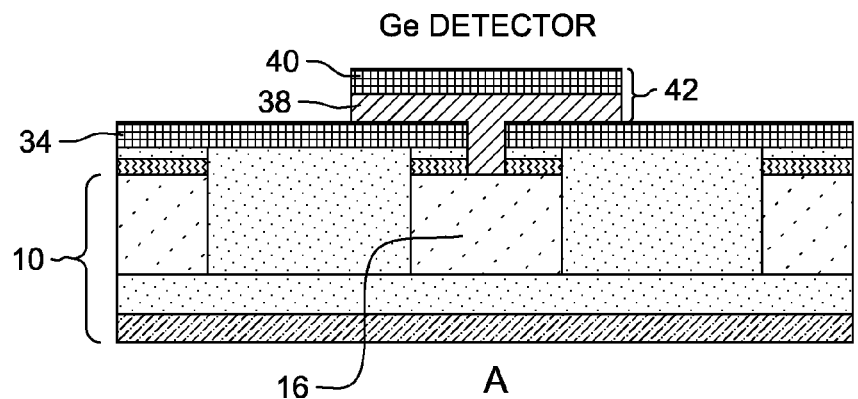
Figure 8:
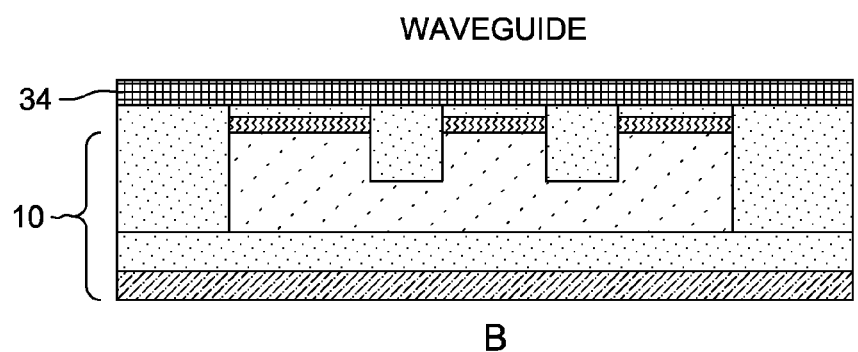
Figure 8:
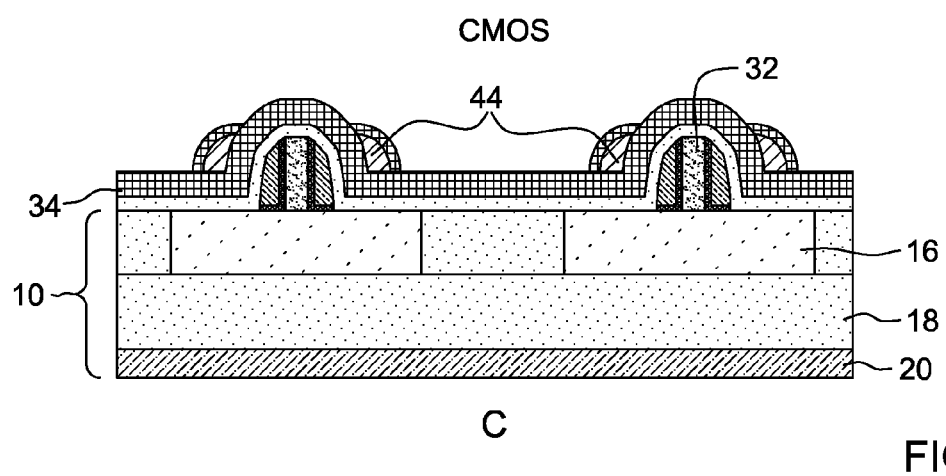

The germanium layer 38 and silicon nitride dielectric capping layer 40 are patterned to result in germanium stack 42 as shown in FIG. 8. The germanium layer 38 and silicon nitride dielectric capping layer 40 are removed from the waveguide and CMOS device. There may be germanium or silicon nitride stringers 44 around the gate structures 32 of the CMOS device. These stringers 44 may be removed later.

Figure 9:
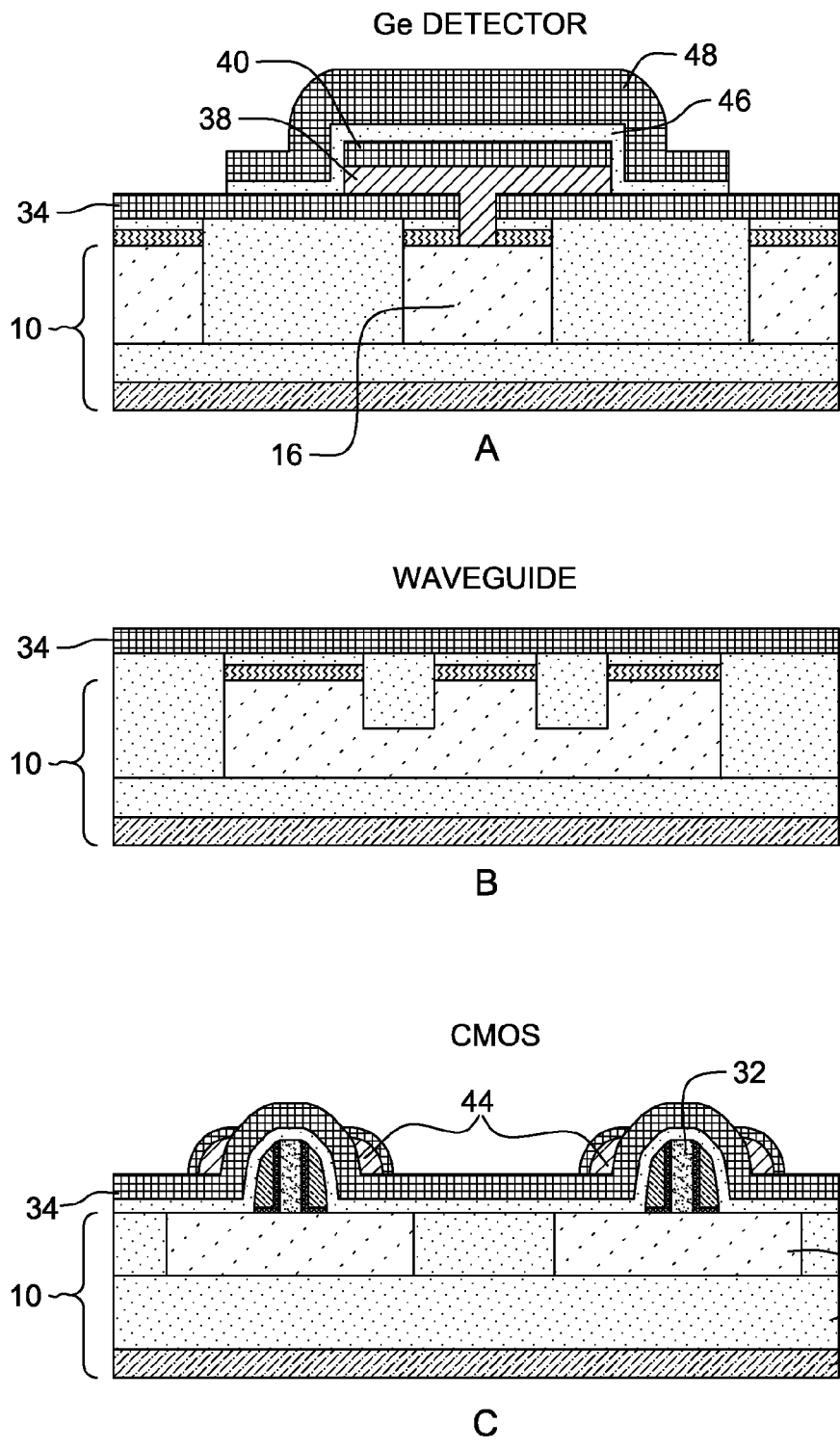

The germanium gate stack 42 is then encapsulated as shown in FIG. 9. A low temperature oxide layer 46 may be deposited by a process such as PECVD, RTCVD or atmospheric pressure chemical vapor deposition (APCVD) at a temperature below about 700 C using a suitable precursor followed by deposition, for example by plasma enhanced chemical vapor deposition, of a layer of silicon nitride dielectric 48. The low temperature oxide 46 and silicon nitride dielectric layer 48 may be patterned so as to only encapsulate the germanium gate stack 42.

Figure 10:
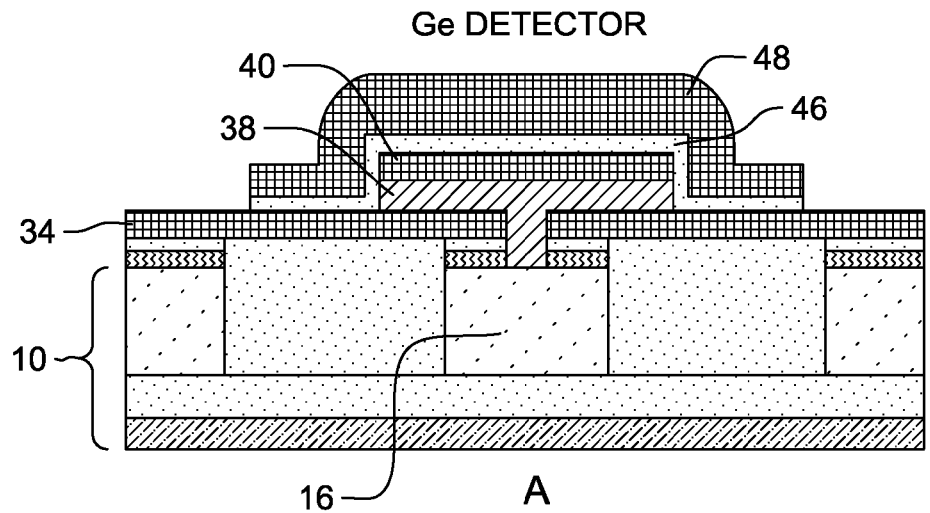
Figure 10:
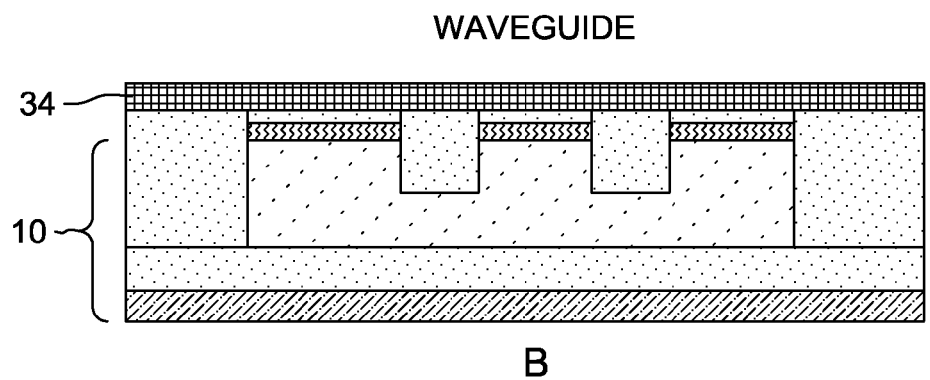
Figure 10:
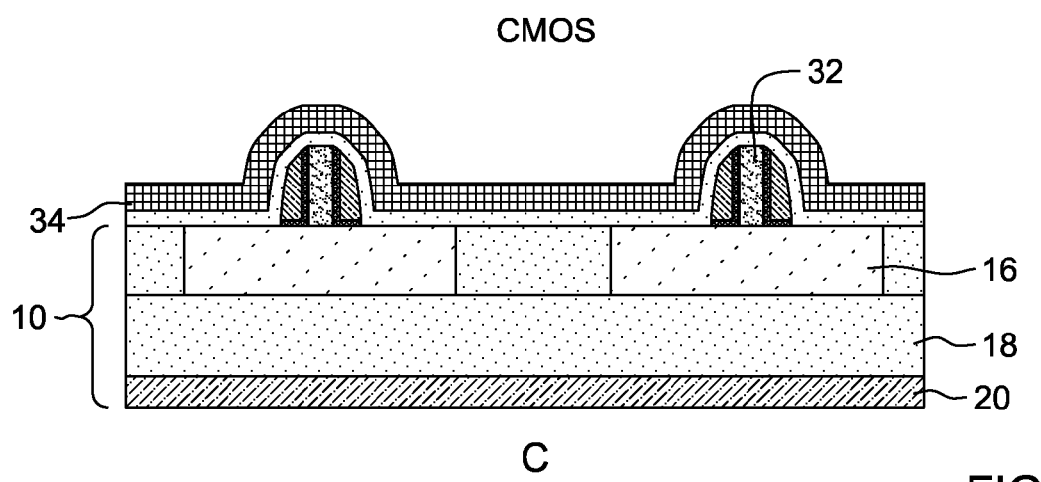

Referring now to FIG. 10, the germanium and silicon nitride stringers 44 may be removed. The silicon nitride stringers may be removed, for example, by a wet chemical etch such as hot phosphoric acid, hydrofluoric acid diluted with ethylene glycol or nondirectional reactive ion etching. The germanium stringers may be removed, for example, by heated peroxide, heated peroxide plus ammonium hydroxide or nitric acid or nondirectional reactive ion etching.

Figure 11:
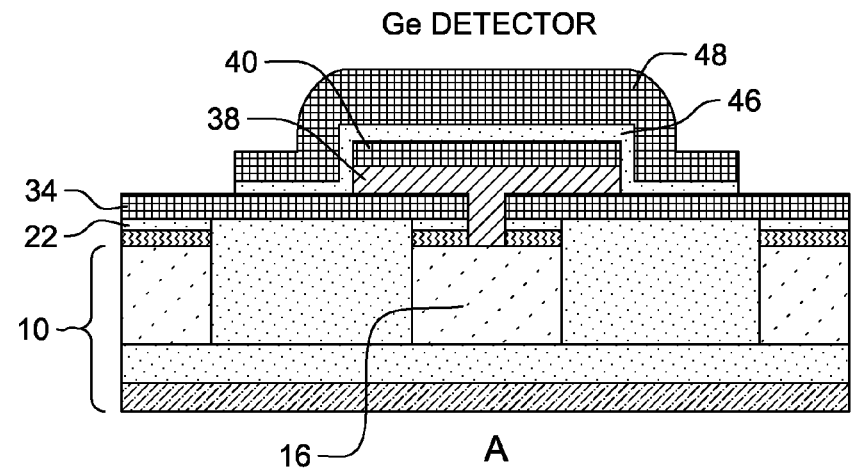
Figure 11:
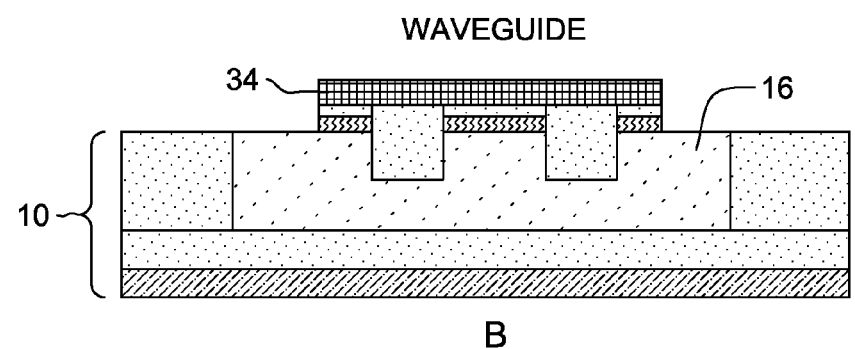
Figure 11:
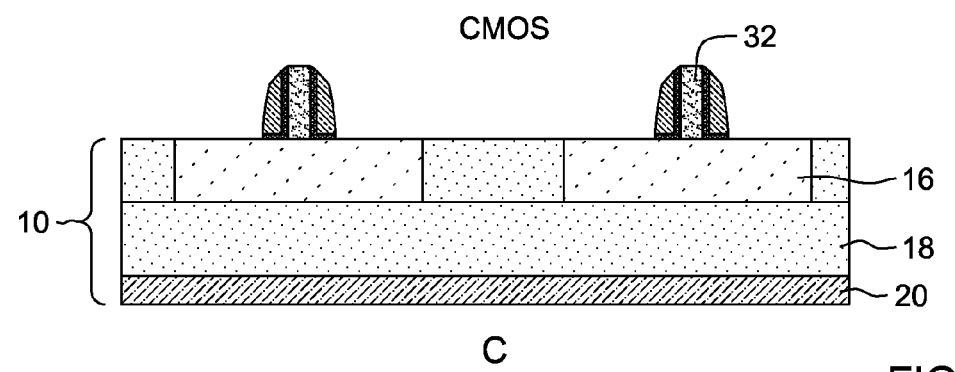

From FIG. 10 to FIG. 11, the silicon nitride dielectric capping layer 34 and pad oxide layer 22 are removed from the CMOS devices and partially removed from the waveguide for the later siliciding of exposed areas. Then, the germanium photodetector, waveguide and CMOS devices are heated for an activation anneal while also crystallizing the germanium by a seeded crystallization from melt process as described previously. The heating may be by heating in the range of about 937 to 1400° C. for about 5 seconds or less which causes melting of the germanium. The process flow returns to the CMOS process flow so that at box 1630 in FIG. 16, exposed portions of the semiconductor layer 16 are silicided. For clarity, the silicided areas are not shown in FIG. 11.

Figure 12:
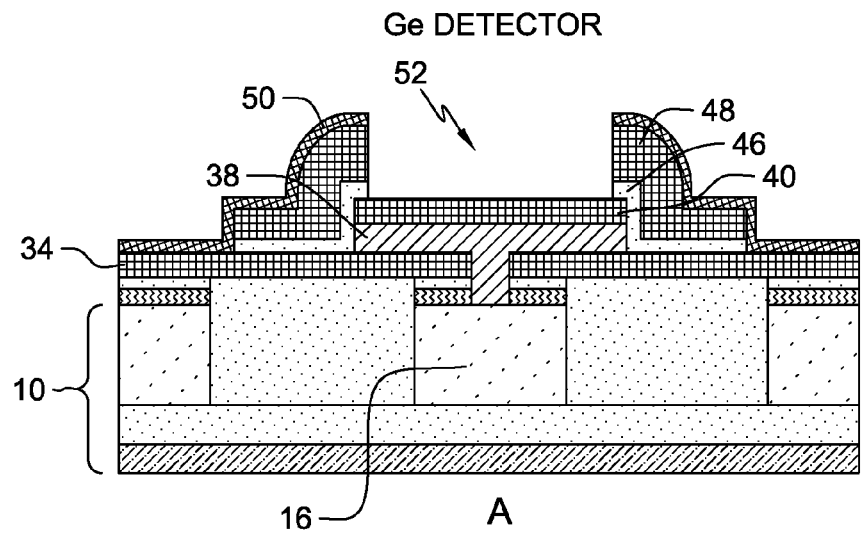
Figure 12:
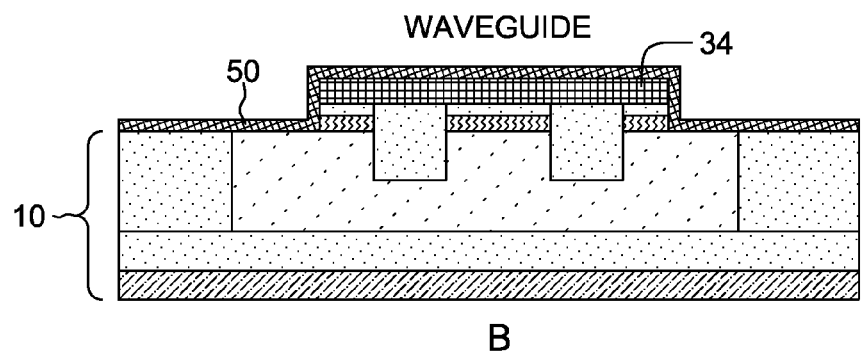
Figure 12:
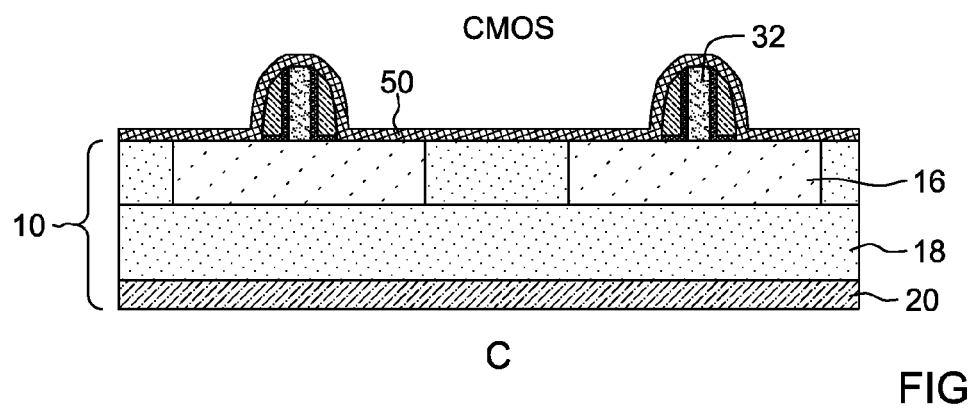
Figure 13:
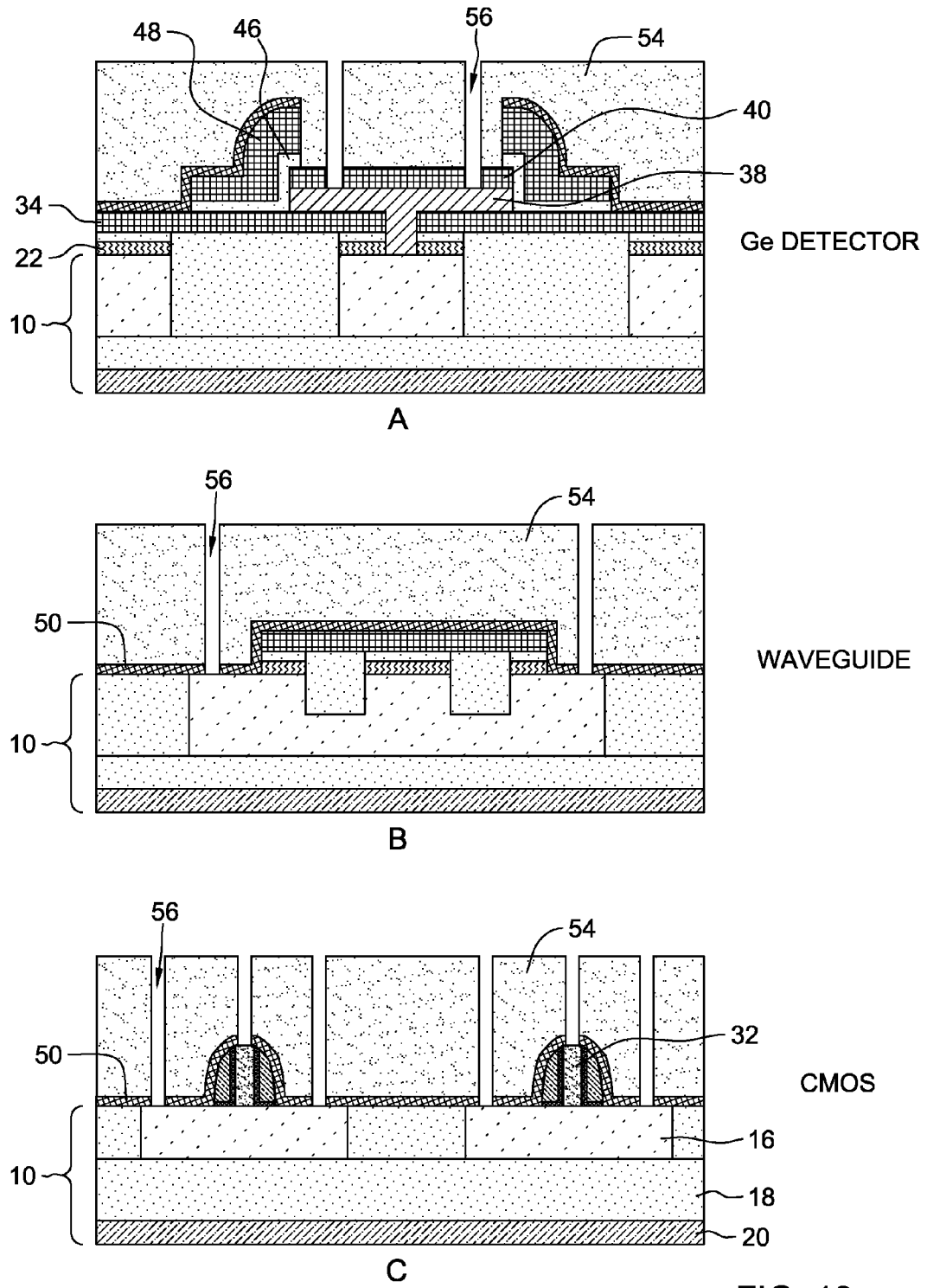
Figure 14:
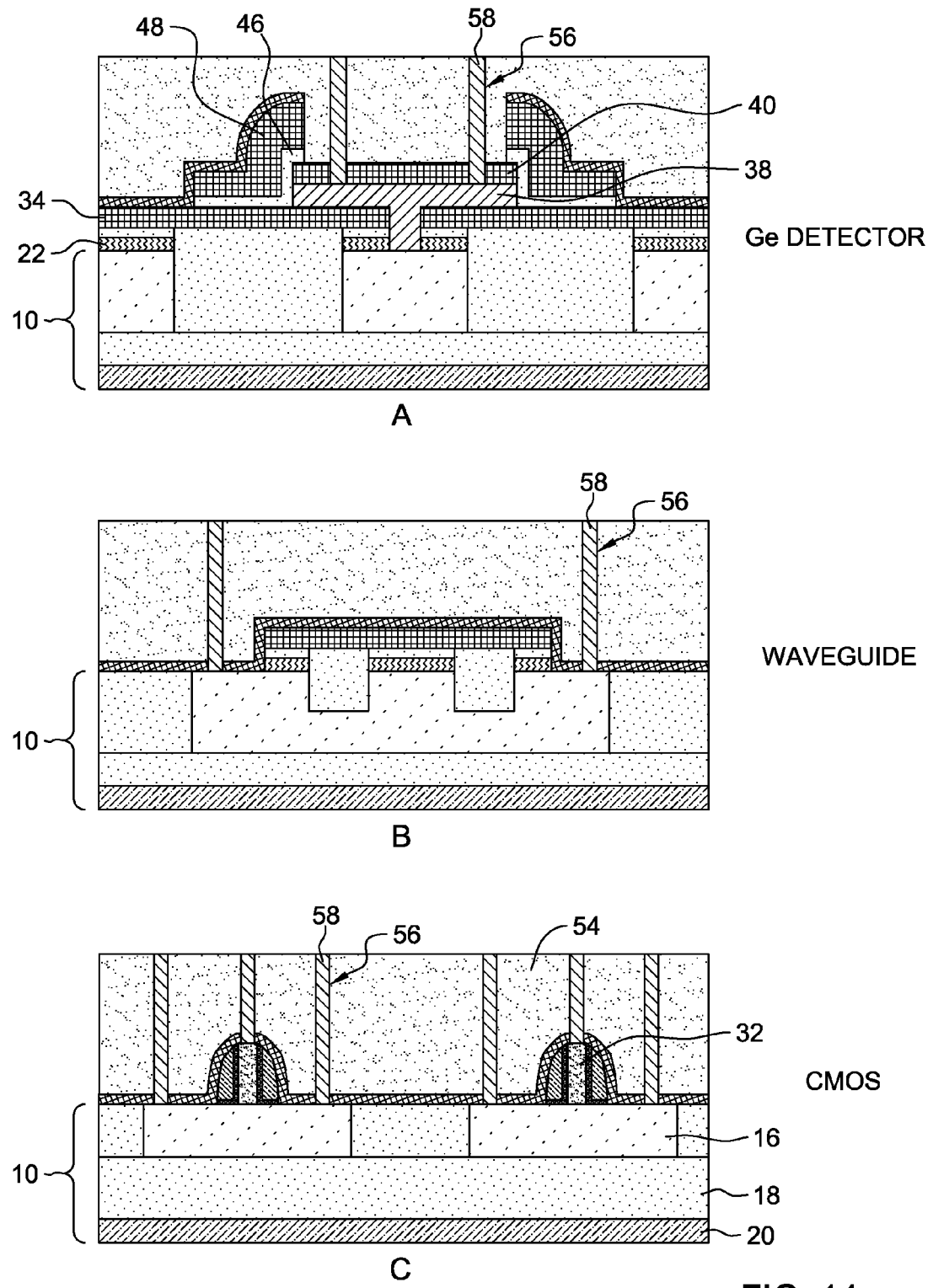

The next step in the CMOS process flow is contact formation, box 1632, in FIG. 16. The CMOs contact formation process is modified to take into account the formation of contacts for the germanium photodetector and waveguide. The modifications are illustrated in FIGS. 12 to 14. In FIG. 12, a thin (about 400 angstroms) silicon nitride dielectric layer 50 is deposited everywhere by a process such as plasma enhanced chemical vapor deposition. The thin silicon nitride dielectric layer 50, encapsulating silicon nitride dielectric layer 48 and encapsulating low temperature oxide 46 are removed from over the germanium stack to result in opening 52 (box 1634 in FIG. 16).

An oxide 54 is conventionally deposited everywhere and then etched, for example by reactive ion etching to form contact vias 56 as shown in FIG. 13 and FIG. 16, boxes 1632, 1636. During the reactive ion etching process, it is also necessary to etch through silicon nitride dielectric capping layer 40 for the germanium photodetector and thin silicon nitride dielectric layer 50 for the waveguide and CMOS device.

According to the flow chart in FIG. 16, box 1632 and box 1638, there is metal fill of the contact vias. The metal may be, for example, tungsten. FIG. 14 shows the contact vias 56 filled with metal 58.

The CMOS process may then continue with formation of the first level of metal (M1) 60 shown in FIG. 15. Further conventional back end of the line (BEOL) processing may then continue until the germanium photodetector, waveguide and CMOS device are completed.

The preceding discussion has focused on a preferred exemplary embodiment. The process flow illustrated in FIG. 16 may be modified for other exemplary embodiments. These modifications to FIG. 16 are illustrated in the modified process flows in FIGS. 17 to 25.

Figure 17:
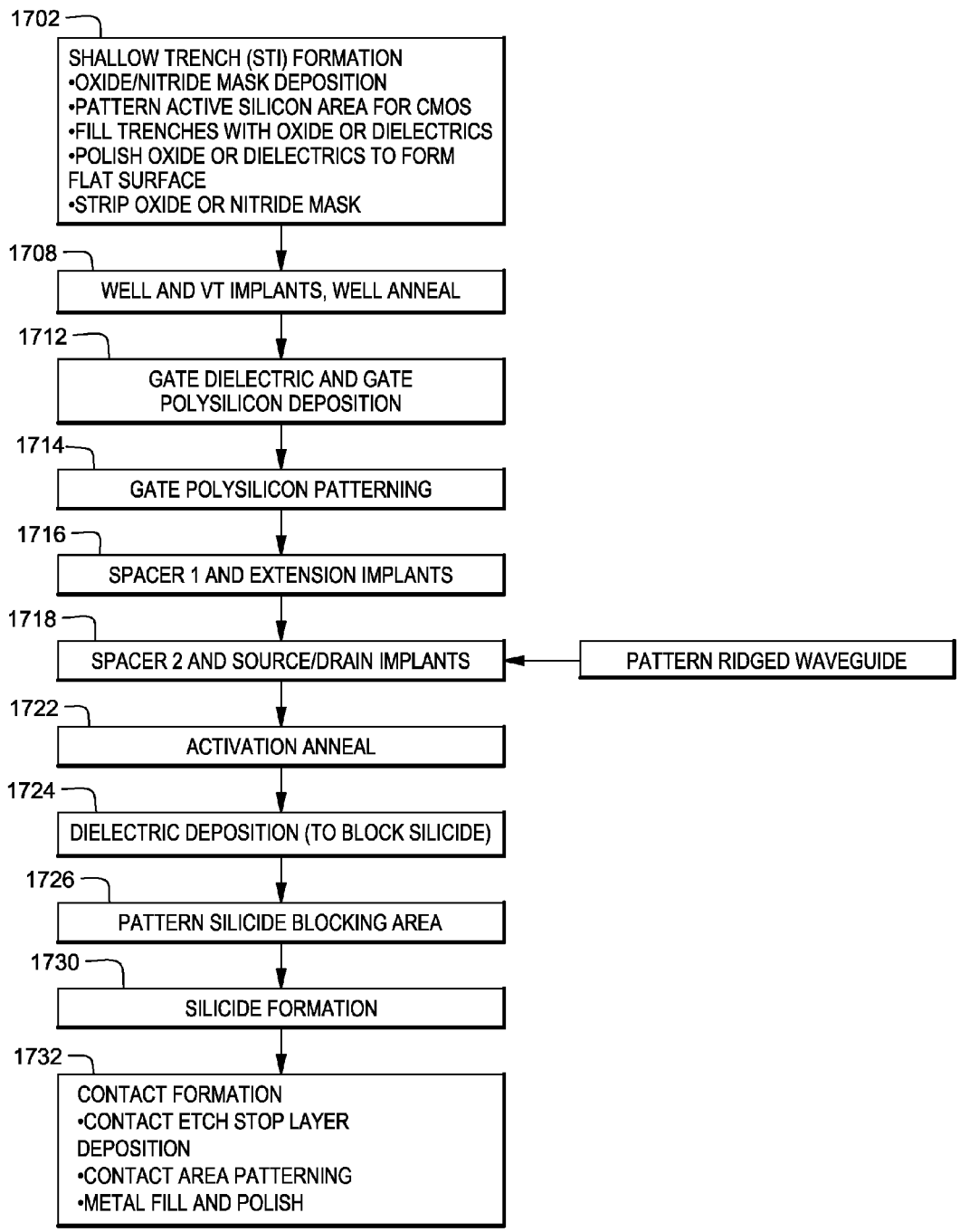

Referring to FIG. 17, the waveguide may be patterned later on in the CMOS manufacturing process. In an exemplary embodiment, the waveguide may be patterned after the formation of spacer 2 but before the source and drain implants referenced in box 1718.

Figure 18:
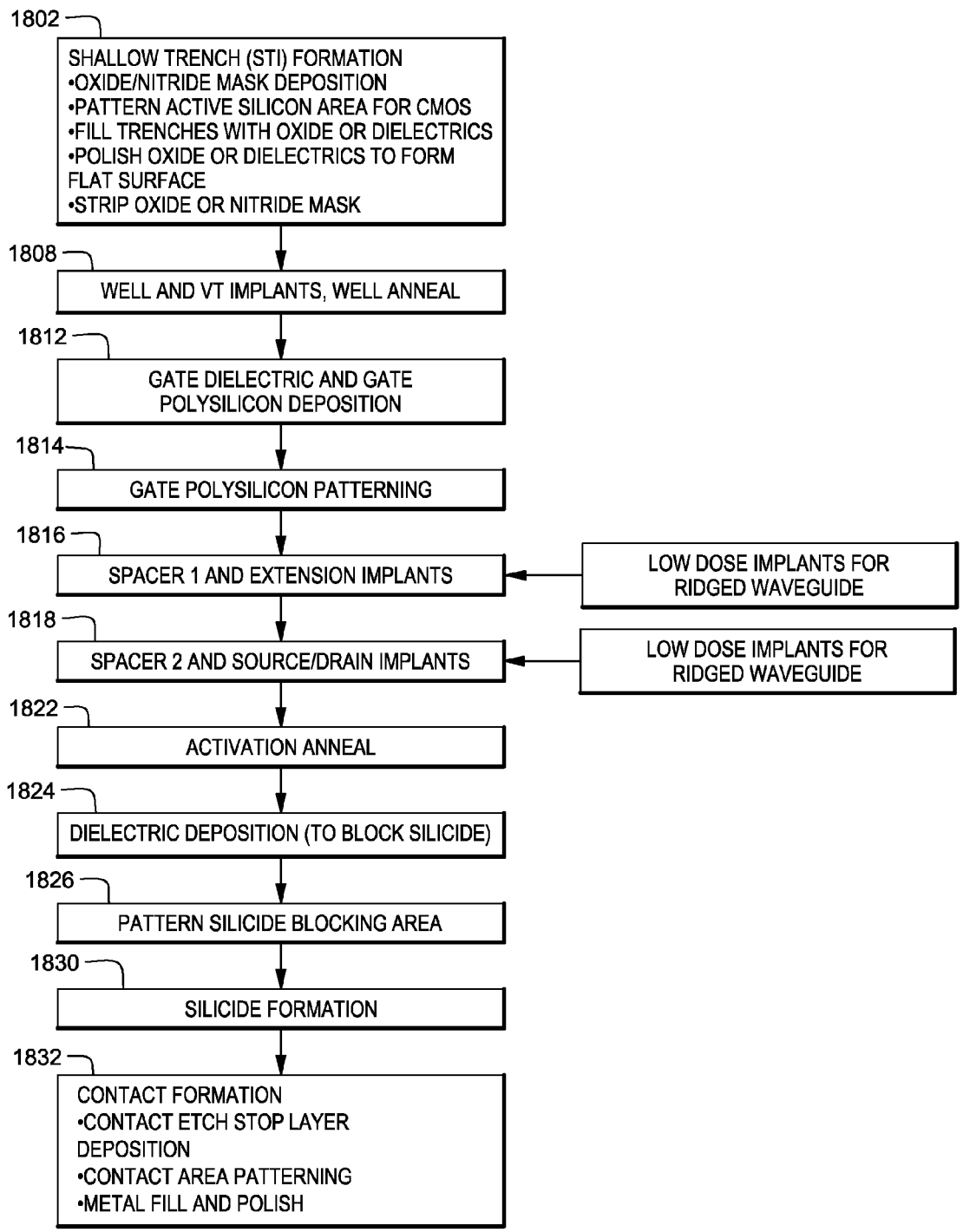

Referring to FIG. 18, the low dose implants may be done later on in the CMOS manufacturing process. In an exemplary embodiment, the low dose implants may be done just before or just after the extension implants referenced in box 1816. In another exemplary embodiment, the low dose implants may be done just before or just after the source and drain implants reference in box 1818.

Figure 19:
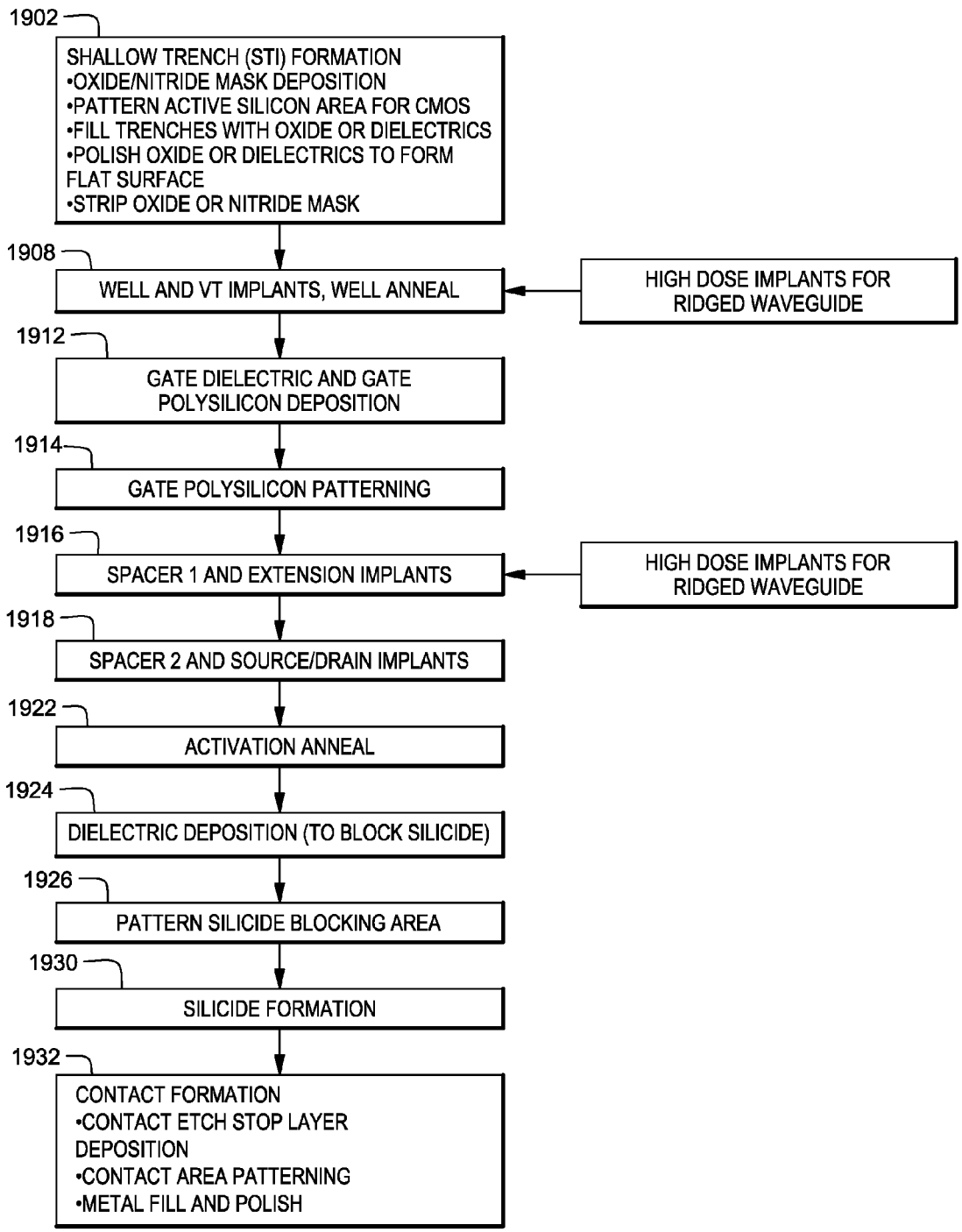

In FIG. 19, the high dose implants may be done earlier in the CMOS manufacturing process. In an exemplary embodiment, the high dose implants may be done just before well anneal referenced in box 1908. In another exemplary embodiment, the high dose implants may be done just before or just after the extension implants referenced in box 1916.

Figure 20:
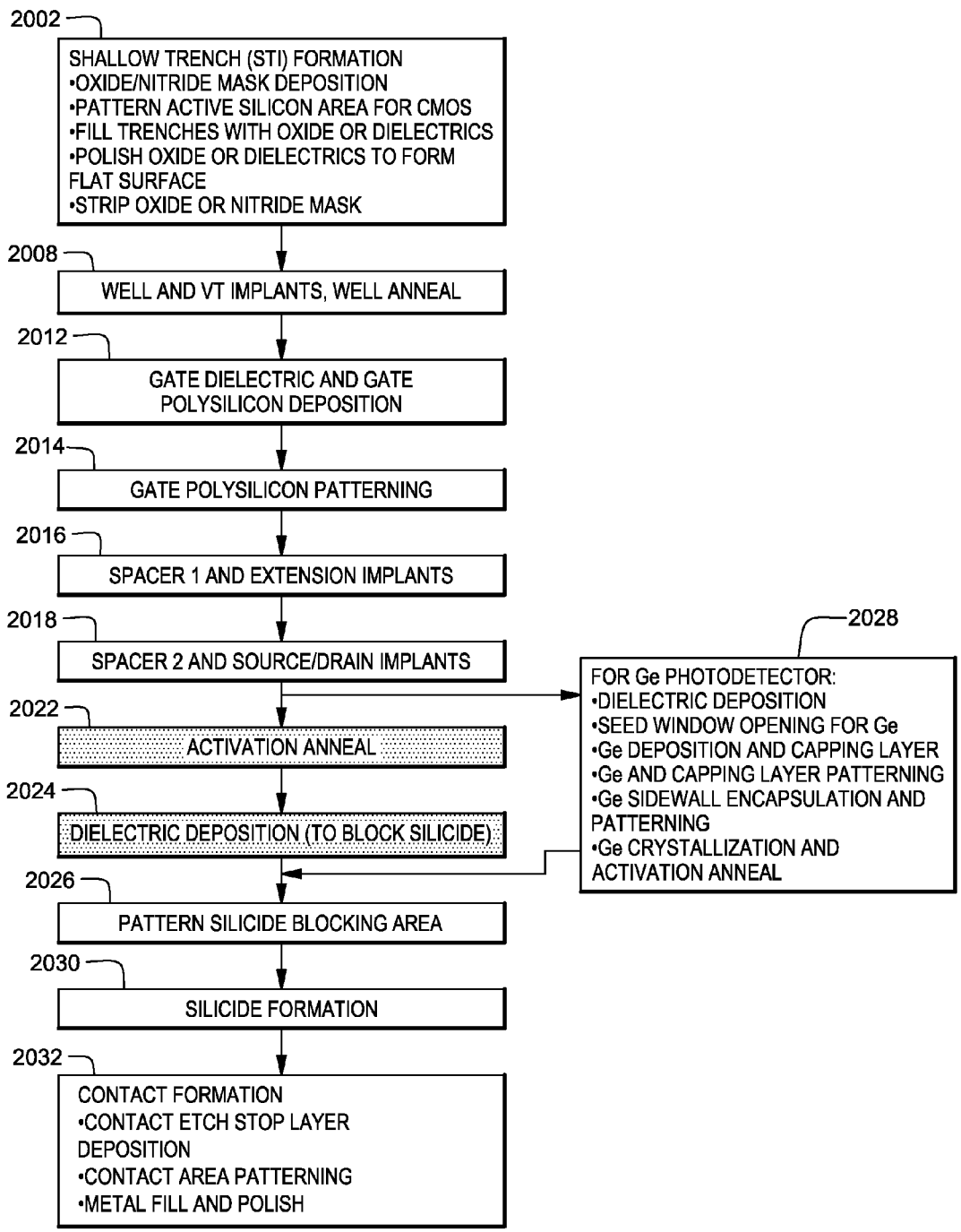

In FIG. 20, the CMOS process flow may be modified so that the CMOS process flow deviates to the germanium photodetector process flow, box 2028, just before activation anneal, box 2024, and returns to the CMOS process flow just after dielectric deposition, box 2026. The processes of activation anneal in box 2024 and dielectric deposition in box 2026 in the CMOS process flow are instead done in the germanium process flow, box 2028.

Figure 21:
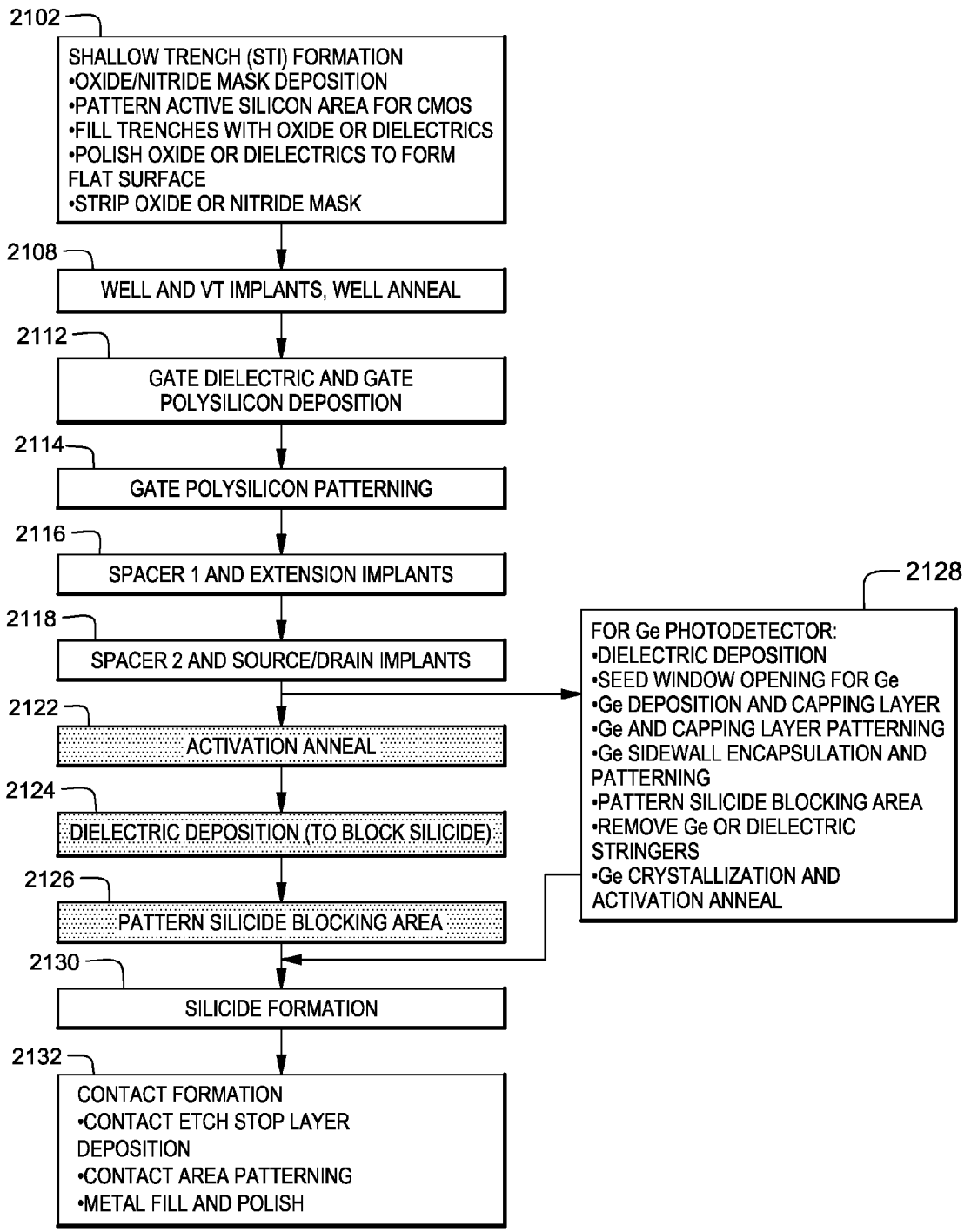

The process flow illustrated in FIG. 21 is identical to the process flow in FIG. 16 except that the germanium photodetector process flow, box 2128, specifically includes the process steps described previously for removing the silicon nitride and germanium stringers shown in FIGS. 8 and 9.

Figure 22:
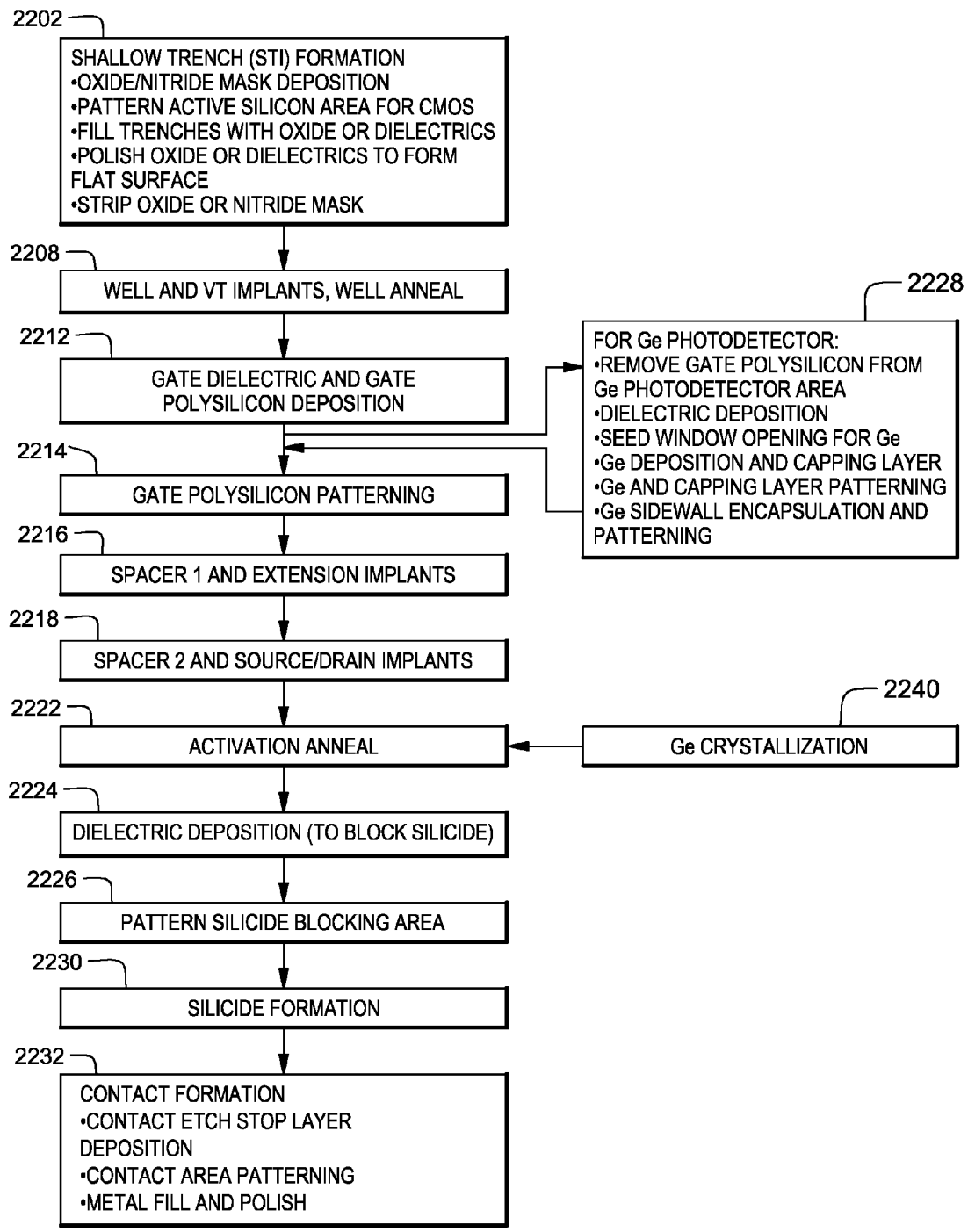

In FIG. 22, a process flow is illustrated in box 2228 wherein the germanium photodetector process flow takes place earlier in the CMOS process flow after the gate dielectric and gate polysilicon deposition, box 2212. The crystallization of the germanium layer is done later on in the CMOS process flow and at the same time as the CMOS activation anneal, boxes 2222, 2240.

Figure 23:
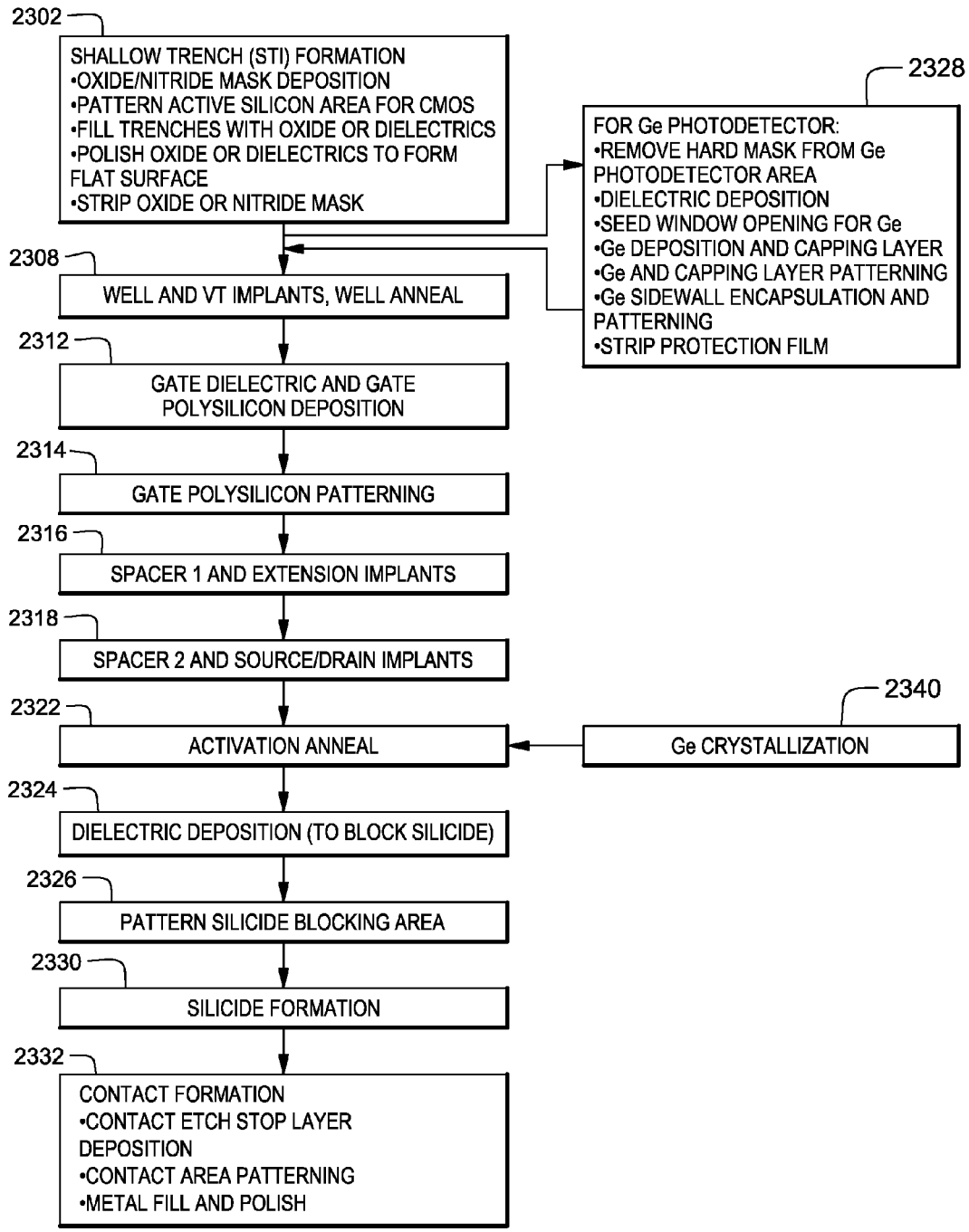

In FIG. 23, a process flow is illustrated in box 2328 wherein the germanium photodetector process flow takes place earlier in the CMOS process flow after the shallow trench isolation, box 2302. The crystallization of the germanium layer is done later on in the CMOS process flow and at the same time as the CMOS activation anneal, boxes 2322, 2340.

Figure 24:
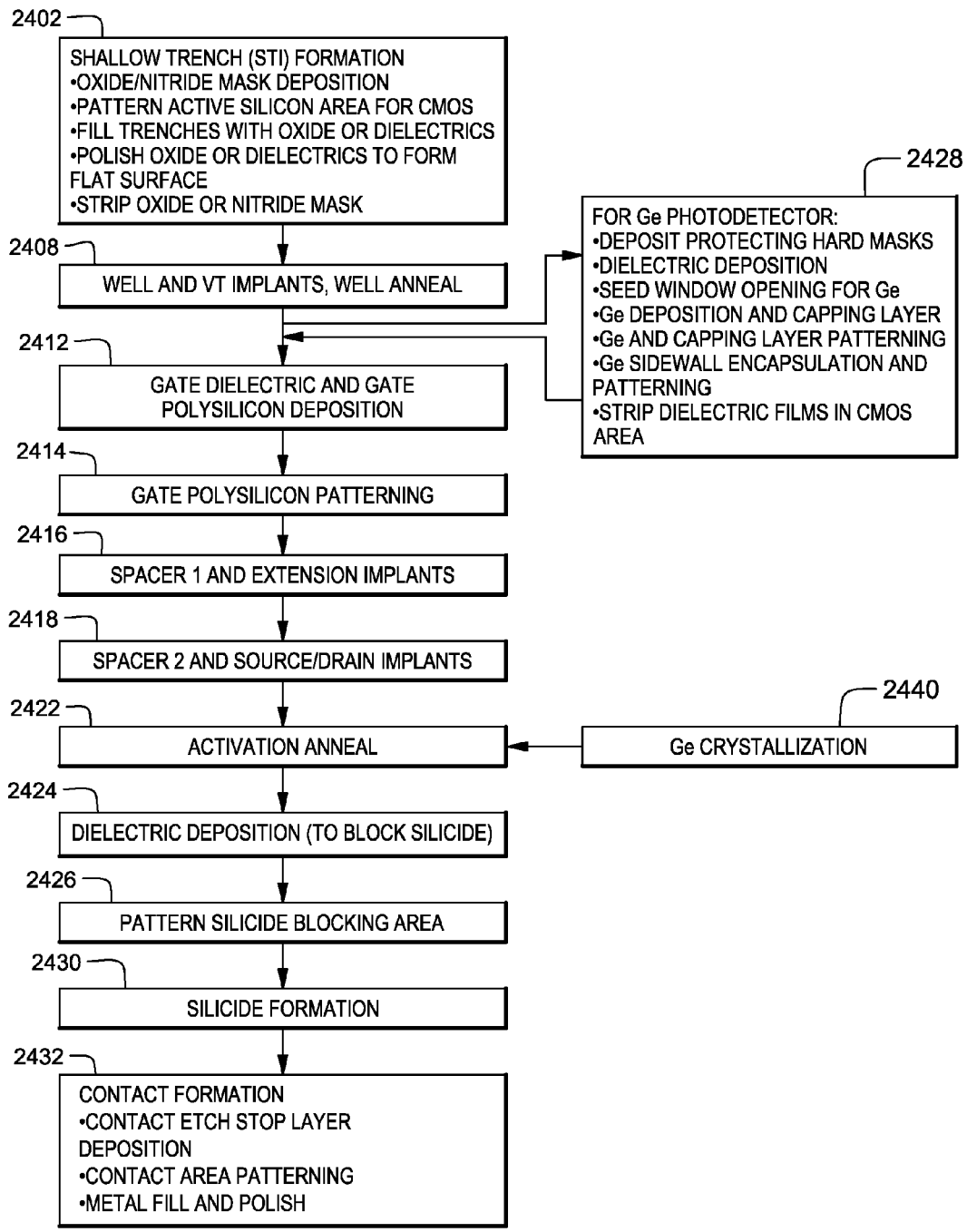

In FIG. 24, a process flow is illustrated in box 2428 wherein the germanium photodetector process flow takes place earlier in the CMOS process flow before the gate dielectric and gate polysilicon deposition, box 2412. The crystallization of the germanium layer is done later on in the CMOS process flow and at the same time as the CMOS activation anneal, boxes 2422, 2440.

Figure 25:
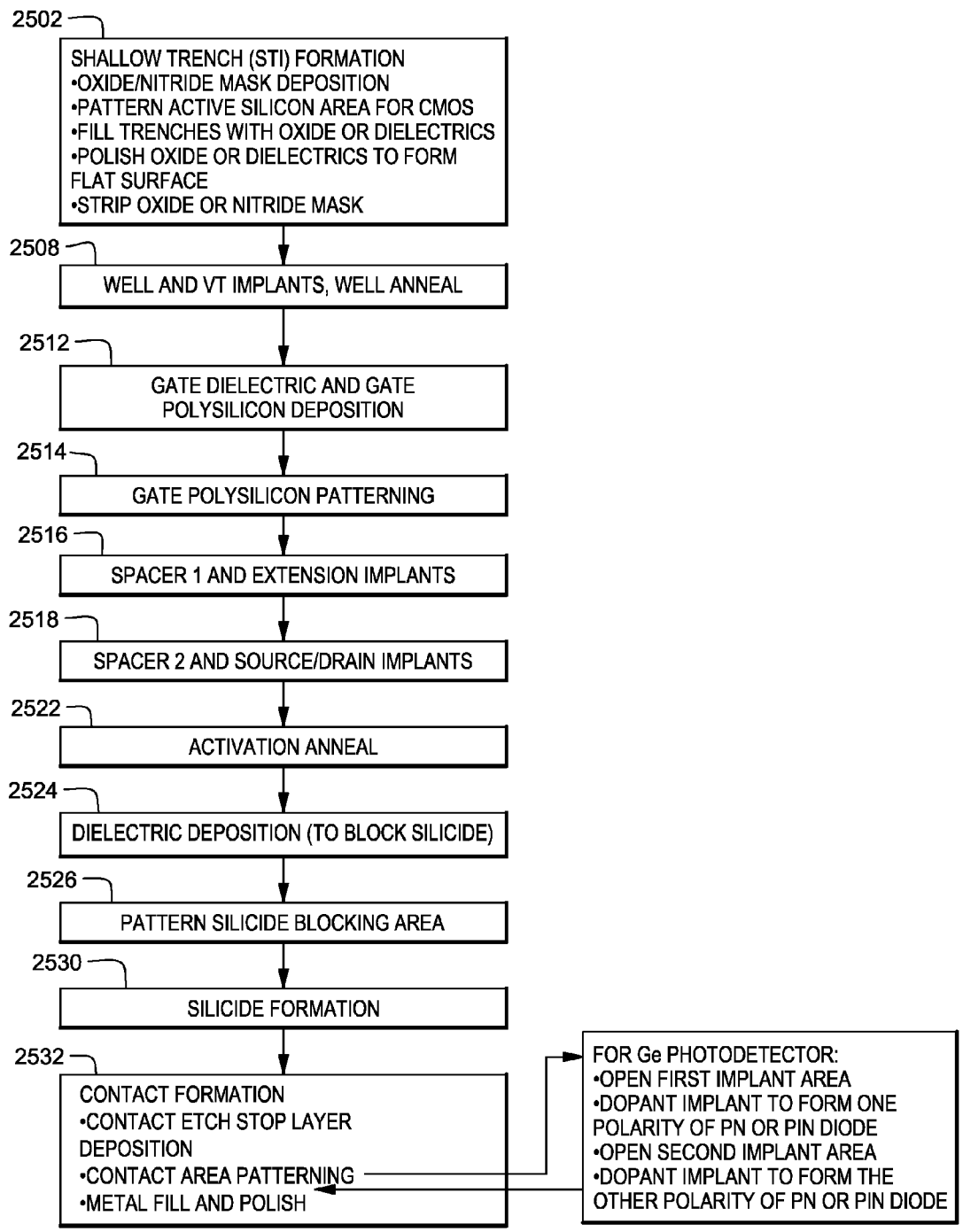

FIG. 25 illustrates a process flow for dopant implants in germanium detectors to form PN or P-I-N diodes instead of metal-semiconductor-metal (MSM) devices. In this process flow, the silicon nitride dielectric capping layer 40 is opened in a first area for a first implant and then n-type or p-type dopant is implanted. The silicon nitride dielectric capping layer 40 is opened in a second area for a second implant and then the other of n-type or p-type dopant is implanted. The implants may be in done through the contact vias 56 shown in FIG. 13. Thereafter, the processing continues as before with the contact vias making contact with the first and second implanted areas.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of incorporating a photonics device into a CMOS manufacturing process flow comprising:
    providing a semiconductor substrate wherein the semiconductor substrate is a semiconductor on insulator substrate comprising a semiconductor material layer on a buried oxide layer;
    processing a first portion of the semiconductor substrate to form a CMOS device according to a CMOS manufacturing process flow comprising:
        patterning the semiconductor material layer in the semiconductor substrate to form first trenches between first pillars of semiconductor material;
        filling the first trenches with an insulator material;
        well and Vt implanting;
        forming a gate structure;
        forming source and drain implants; and
        forming contacts; and
    processing a second portion of the semiconductor substrate according to a process flow for a photonics device comprising:
        patterning a semiconductor material layer in the semiconductor substrate to form second trenches between second pillars of semiconductor material;
        filling the second trenches with an insulator material;
        depositing a dielectric material over the second portion;
        opening a window in the dielectric material to expose an underlying second pillar of semiconductor material;
        depositing a layer of germanium over the first and second portions including over the dielectric material;
        depositing a first insulating layer over the germanium layer;
        patterning the germanium layer and first insulating layer over the second portion and removing the germanium layer and first insulating layer from the first portion; and
        depositing a nitride layer over the germanium layer and first insulating layer so as to encapsulate the germanium layer and first insulating layer; and
    wherein the process steps of patterning a semiconductor material layer through depositing a nitride layer over the germanium layer in the processing the second portion of the semiconductor substrate occur after filling the first trenches with an insulator material in the processing the first portion of the semiconductor substrate; and
    processing the second portion of the semiconductor substrate further comprising:
        opening the first insulating layer and the nitride layer to form an opening;
        depositing an oxide material over the first and second portions and in the opening; and
        depositing a metallic material to make contact with the germanium layer.

2. The method of claim 1 wherein the process steps of patterning a semiconductor material layer through depositing a nitride layer over the germanium layer of processing the second portion of the semiconductor substrate occur after forming the gate structure in the processing of the first portion of the semiconductor substrate.

3. The method of claim 1 wherein the process steps of patterning a semiconductor material layer through depositing a nitride layer over the germanium layer of processing the second portion of the semiconductor substrate occur after forming the gate structure in the processing of the first portion of the semiconductor substrate, wherein during the process steps, germanium stringers form on the gate structure and further comprising removing the germanium stringers.

4. The method of claim 1 wherein the process steps of patterning a semiconductor material layer through depositing a nitride layer over the germanium layer of processing the second portion of the semiconductor substrate occur during forming the gate structure in the processing of the first portion of the semiconductor substrate.

5. The method of claim 1 wherein the process steps of patterning a semiconductor material layer through depositing a nitride layer over the germanium layer of processing the second portion of the semiconductor substrate occur just before or just after well and Vt implanting in the processing of the first portion of the semiconductor substrate.

6. The method of claim 1 wherein the photonics device is a germanium photodetector.

7. The method of claim 1 wherein processing of the second portion further comprises a crystallization anneal to crystallize the germanium layer by a seeded crystallization from melt process.

8. The method of claim 1 further comprising processing a third portion of the semiconductor substrate according to a process flow for a second photonics device comprising:
    patterning a semiconductor material layer in the semiconductor substrate to form third trenches between third pillars of semiconductor material;
    filling the third trenches with an insulator material;
    low dose implanting at least one of the third pillars to form a pn or p-i-n junction; and
    high dose implanting at least another one of the third pillars to form a low resistance contact.

9. The method of claim 8 wherein the photonics device is a germanium photodetector and the second photonics device is a waveguide.

10. A method of incorporating a photonics device into a CMOS manufacturing process flow comprising:
providing a semiconductor substrate wherein the semiconductor substrate is a semiconductor on insulator substrate comprising a semiconductor material layer on a buried oxide layer;
processing a first portion of the semiconductor substrate to form a CMOS device according to a CMOS manufacturing process flow comprising:
patterning the semiconductor material layer in the semiconductor substrate to form first trenches between first pillars of semiconductor material;
filling the first trenches with an insulator material;
well and Vt implanting;
forming a gate structure;
forming source and drain implants; and
forming contacts; and
processing a second portion of the semiconductor substrate according to a process flow for a photonics device comprising:
patterning a semiconductor material layer in the semiconductor substrate to form second trenches between second pillars of semiconductor material;
filling the second trenches with an insulator material;
depositing a dielectric material over the second portion;
opening a window in the dielectric material to expose an underlying second pillar of semiconductor material;
depositing a layer of germanium over the first and second portions including over the dielectric material;
depositing a first insulating layer over the germanium layer;
patterning the germanium layer and first insulating layer over the second portion and removing the germanium layer and first insulating layer from the first portion; and
depositing a nitride layer over the germanium layer and first insulating layer so as to encapsulate the germanium layer and first insulating layer; and
processing the second portion of the semiconductor substrate during the forming contacts step in the processing the first portion, further comprising:
opening the first insulating layer and the nitride layer in a first area to expose a first area of the germanium layer;
implanting a dopant in the first area of the germanium layer;
opening the first insulating layer and the nitride layer in a second area to expose a second area of the germanium layer; and
implanting a second dopant in the second area of the germanium layer.

11. A method of incorporating a photonics device into a CMOS manufacturing process flow comprising:
providing a semiconductor substrate;
processing a first portion of the semiconductor substrate to form a CMOS device according to a CMOS manufacturing process flow comprising;
patterning the semiconductor material layer in the semiconductor substrate to form first trenches between first pillars of semiconductor material;
filling the first trenches with an insulator material;
well and Vt implanting;
forming a gate structure;
forming source and drain implants; and
forming contacts; and
processing a second portion of the semiconductor substrate according to a process flow for a first photonics device comprising:
patterning a semiconductor material layer in the semiconductor substrate to form second trenches between second pillars of semiconductor material;
filling the second trenches with an insulator material;
low dose implanting at least one of the second pillars to form a pn or p-i-n junction;
high dose implanting at least another one of the second pillars to form a low resistance contact; and
processing a third portion of the semiconductor substrate according to a process flow for a second photonics device comprising:
patterning a semiconductor material layer in the semiconductor substrate to form third trenches between third pillars of semiconductor material;
filling the third trenches with an insulator material;
depositing a dielectric material over the third portion;
opening a window in the dielectric material to expose an underlying third pillar of semiconductor material;
depositing a layer of germanium over the first and third portions including over the dielectric material;
depositing a first insulating layer over the germanium layer;
patterning the germanium layer and first insulating layer over the third portion and removing the germanium layer and first insulating layer from the first portion; and
depositing a nitride layer over the germanium layer and first insulating layer so as to encapsulate the germanium layer and first insulating layer;
wherein the process steps of patterning a semiconductor material layer through depositing a nitride layer over the germanium layer in the processing the third portion of the semiconductor substrate occur after filling the first trenches with an insulator material in the processing of the first portion of the semiconductor substrate; and
processing the third portion of the semiconductor substrate further comprising:
opening the first insulating layer and the nitride layer to form an opening;
depositing an oxide material over the first and third portions and in the opening; and
depositing a metallic material to make contact with the germanium layer in the third portion.

12. The method of claim 11 wherein the process steps of patterning a semiconductor material layer through depositing a nitride layer over the germanium layer of processing the third portion of the semiconductor substrate occur after forming the gate structure in the processing of the first portion of the semiconductor substrate.

13. The method of claim 11 wherein the process steps of patterning a semiconductor material layer through depositing a nitride layer over the germanium layer of processing the third portion of the semiconductor substrate occur after forming the gate structure in the processing of the first portion of the semiconductor substrate, wherein during the process steps, germanium stringers form on the gate structure and further comprising removing the germanium stringers.

14. The method of claim 11 wherein the process steps of patterning a semiconductor material layer through depositing a nitride layer over the germanium layer of processing the third portion of the semiconductor substrate occur during forming the gate structure in the processing of the first portion of the semiconductor substrate.

15. The method of claim 11 wherein the process steps of patterning a semiconductor material layer through depositing a nitride layer over the germanium layer of processing the third portion of the semiconductor substrate occur just before or just after well and Vt implanting in the processing of the first portion of the semiconductor substrate.

16. The method of claim 11 wherein the first photonics device is a waveguide and the second photonics device is a germanium photodetector.

17. The method of claim 11 wherein processing of the third portion further comprises a crystallization anneal to crystallize the germanium layer by a seeded crystallization from melt process.

* * * * *